(12) United States Patent
Lardo et al.

(10) Patent No.: US 7,551,953 B2
(45) Date of Patent: *Jun. 23, 2009

(54) MAGNETIC RESONANCE IMAGING NEEDLE ANTENNAS

(75) Inventors: Albert C. Lardo, Baldwin, MD (US); Elliott R. McVeigh, Potomac, MD (US); Henry R. Halperin, Baltimore, MD (US)

(73) Assignee: SurgiVision, Inc., Memphis, TN (US)

( * ) Notice: Subject to any disclaimer, the term of this patent is extended or adjusted under 35 U.S.C. 154(b) by 604 days.

This patent is subject to a terminal disclaimer.

(21) Appl. No.: 10/640,406

(22) Filed: Aug. 12, 2003

(65) Prior Publication Data

US 2004/0199071 A1   Oct. 7, 2004

Related U.S. Application Data

(63) Continuation of application No. 09/775,338, filed on Feb. 1, 2001, now Pat. No. 6,606,513, which is a continuation-in-part of application No. 09/536,090, filed on Mar. 24, 2000, now Pat. No. 6,675,033.

(60) Provisional application No. 60/178,933, filed on Feb. 1, 2000, provisional application No. 60/129,364, filed on Apr. 15, 1999.

(51) Int. Cl.
*A61B 5/055* (2006.01)
(52) U.S. Cl. .................. 600/411; 600/424; 600/423
(58) Field of Classification Search ................ 600/410, 600/411, 423, 424; 324/318, 322
See application file for complete search history.

(56) References Cited

U.S. PATENT DOCUMENTS

| | | | |
|---|---|---|---|
| 3,342,175 A | 9/1967 | Bulloch | 128/2 |
| 4,431,005 A | 2/1984 | McCormick | 128/656 |
| 4,445,501 A | 5/1984 | Bresler | 128/1.5 |
| 4,554,929 A | 11/1985 | Samson et al. | 128/772 |
| 4,572,198 A | 2/1986 | Codrington | 128/653 |
| 4,643,186 A | 2/1987 | Rosen et al. | 128/303.1 |
| 4,672,972 A | 6/1987 | Berke | 128/653 |
| 4,682,125 A | 7/1987 | Harrison et al. | 333/12 |
| 4,766,381 A | 8/1988 | Conturo et al. | 324/309 |
| 4,776,341 A | 10/1988 | Bachus et al. | 128/653 |
| 4,791,372 A | 12/1988 | Kirk et al. | 324/318 |

(Continued)

FOREIGN PATENT DOCUMENTS

EP   0 659 385 A1   6/1995

(Continued)

OTHER PUBLICATIONS

Atalar et al.; "High Resolution Intravascular MRI and MRS using a Catheter Receiver Coil,", Magnetic Resonance in Medicine, 36:596-605 (1996).

(Continued)

*Primary Examiner*—Ruth S Smith
(74) *Attorney, Agent, or Firm*—Darby & Darby PC

(57) ABSTRACT

The invention describes a system, method, and means for an MRI transseptal needle that can be visible on an MRI, can act as an antenna and receive MRI signals from surrounding subject matter to generate high-resolution images and can enable real-time active needle tracking during MRI guided transseptal puncture procedures.

103 Claims, 20 Drawing Sheets

U.S. PATENT DOCUMENTS

| | | | |
|---|---|---|---|
| 4,793,356 A | 12/1988 | Misic et al. ................. 128/653 |
| 4,813,429 A | 3/1989 | Eshel et al. ................. 128/736 |
| 4,823,812 A | 4/1989 | Eshel et al. ................. 128/804 |
| 4,858,613 A | 8/1989 | Fry et al. ............... 128/660.03 |
| 4,859,950 A | 8/1989 | Keren .......................... 324/322 |
| 4,897,604 A | 1/1990 | Carlson et al. .............. 324/318 |
| 4,922,204 A | 5/1990 | Duerr et al. .................. 324/322 |
| 4,932,411 A | 6/1990 | Fritschy et al. ............. 128/653 |
| 4,960,106 A | 10/1990 | Kubokawa ...................... 128/6 |
| 5,019,075 A | 5/1991 | Spears et al. .................... 606/7 |
| 5,035,231 A | 7/1991 | Kubokawa et al. ............. 128/6 |
| 5,050,607 A | 9/1991 | Bradley et al. .......... 128/653 A |
| 5,090,959 A | 2/1992 | Samson et al. ................. 604/96 |
| 5,095,911 A | 3/1992 | Pomeranz ............. 128/662.06 |
| 5,099,208 A | 3/1992 | Fitzpatrick et al. .......... 324/312 |
| 5,167,233 A | 12/1992 | Eberle et al. ........... 128/662.06 |
| 5,170,789 A | 12/1992 | Narayan et al. .......... 128/653.5 |
| 5,190,046 A | 3/1993 | Shturman ............... 128/662.06 |
| 5,211,165 A | 5/1993 | Dumoulin et al. ........ 128/653.1 |
| 5,211,166 A | 5/1993 | Sepponen ............... 128/653.5 |
| 5,217,010 A | 6/1993 | Tsitlik et al. ............. 128/419 PG |
| 5,260,658 A | 11/1993 | Greim et al. ................. 324/322 |
| 5,270,485 A | 12/1993 | Jacobsen ................... 174/15.1 |
| 5,271,400 A | 12/1993 | Dumoulin et al. ........ 128/653.2 |
| 5,293,872 A | 3/1994 | Alfano et al. ............... 128/664 |
| 5,294,886 A | 3/1994 | Duerr ......................... 324/318 |
| 5,307,808 A | 5/1994 | Dumoulin et al. ........ 128/653.2 |
| 5,307,814 A | 5/1994 | Kressel et al. ........... 128/653.5 |
| 5,318,025 A | 6/1994 | Dumoulin et al. ........ 128/653.2 |
| 5,323,778 A | 6/1994 | Kandarpa et al. ........ 128/653.2 |
| 5,347,221 A | 9/1994 | Rubinson .................... 324/318 |
| 5,348,010 A | 9/1994 | Schnall et al. ........... 128/653.2 |
| 5,352,979 A | 10/1994 | Conturo ...................... 324/307 |
| 5,355,087 A | 10/1994 | Claiborne et al. ........... 324/322 |
| 5,358,515 A | 10/1994 | Hürter et al. ................. 607/101 |
| 5,365,928 A | 11/1994 | Rhinehart et al. ........ 128/653.5 |
| 5,370,644 A | 12/1994 | Langberg ...................... 606/33 |
| 5,372,138 A | 12/1994 | Crowley et al. ........ 128/662.06 |
| 5,375,596 A | 12/1994 | Twiss et al. .............. 128/653.1 |
| 5,400,787 A | 3/1995 | Marandos ................ 128/653.5 |
| 5,411,476 A | 5/1995 | Abrams et al. ................. 604/176 |
| 5,413,104 A | 5/1995 | Buijs et al. ............... 128/653.5 |
| 5,419,325 A | 5/1995 | Dumoulin et al. ........ 128/653.2 |
| 5,421,338 A | 6/1995 | Crowley et al. ........ 128/662.06 |
| 5,429,132 A | 7/1995 | Guy et al. ................. 128/653.1 |
| 5,435,302 A | 7/1995 | Lenkinski et al. ........... 600/422 |
| 5,437,277 A | 8/1995 | Dumoulin et al. ........ 128/653.1 |
| 5,439,000 A | 8/1995 | Gunderson et al. .......... 128/664 |
| 5,443,066 A | 8/1995 | Dumoulin et al. ........ 128/653.1 |
| 5,443,489 A | 8/1995 | Ben-Haim ................... 607/115 |
| 5,447,156 A | 9/1995 | Dumoulin et al. ........ 128/653.2 |
| 5,451,232 A | 9/1995 | Rhinehart et al. ........... 606/192 |
| 5,451,774 A | 9/1995 | Jacobsen ............... 250/227.24 |
| 5,462,055 A | 10/1995 | Casey et al. ............. 128/653.5 |
| 5,476,095 A | 12/1995 | Schnall et al. ........... 128/653.5 |
| 5,498,261 A | 3/1996 | Strul ............................ 606/29 |
| 5,507,743 A | 4/1996 | Edwards et al. ............... 606/41 |
| 5,512,825 A | 4/1996 | Atalar et al. ................. 324/309 |
| 5,520,644 A | 5/1996 | Imran .......................... 604/95 |
| 5,524,630 A | 6/1996 | Crowley ............... 128/662.06 |
| 5,540,679 A | 7/1996 | Fram et al. .................... 606/27 |
| 5,558,093 A | 9/1996 | Pomeranz ............. 128/660.03 |
| 5,578,008 A | 11/1996 | Hara ............................ 604/96 |
| 5,588,432 A | 12/1996 | Crowley ............... 128/660.03 |
| 5,598,097 A | 1/1997 | Scholes et al. ............... 324/316 |
| 5,609,606 A | 3/1997 | O'Boyle ...................... 606/194 |
| 5,611,807 A | 3/1997 | O'Boyle ...................... 606/169 |
| 5,617,874 A | 4/1997 | Baran .......................... 128/753 |
| 5,623,241 A | 4/1997 | Minkoff ...................... 335/296 |
| 5,647,361 A | 7/1997 | Damadian ................. 128/683.2 |
| 5,660,180 A | 8/1997 | Malinowski et al. ... 128/660.03 |
| 5,682,897 A | 11/1997 | Pomeranz ............. 128/662.06 |
| 5,699,801 A | 12/1997 | Atalar et al. ............. 128/653.2 |
| 5,715,825 A | 2/1998 | Crowley ................ 128/602.06 |
| 5,728,079 A | 3/1998 | Weber et al. ................. 604/280 |
| 5,738,632 A | 4/1998 | Karasawa .................... 600/410 |
| 5,775,338 A | 7/1998 | Hastings ..................... 128/898 |
| 5,792,055 A | 8/1998 | McKinnon .................. 600/410 |
| 5,833,632 A | 11/1998 | Jacobsen et al. ............ 600/585 |
| 5,840,031 A | 11/1998 | Crowley ..................... 600/440 |
| 5,868,674 A | 2/1999 | Glowinski et al. .......... 600/410 |
| 5,916,162 A | 6/1999 | Snelten et al. .............. 600/411 |
| 5,928,145 A * | 7/1999 | Ocali et al. ................. 600/410 |
| 5,938,609 A | 8/1999 | Pomeranz ................... 600/439 |
| 5,938,692 A | 8/1999 | Rudie ......................... 607/101 |
| 5,964,705 A | 10/1999 | Truwit et al. ................. 600/423 |
| 5,968,052 A | 10/1999 | Sullivan, III et al. ........ 606/108 |
| 6,004,269 A | 12/1999 | Crowley et al. ............. 600/439 |
| 6,011,995 A | 1/2000 | Guglielmi et al. ............. 607/99 |
| 6,019,737 A | 2/2000 | Murata ........................ 600/585 |
| 6,026,316 A | 2/2000 | Kucharczyk et al. ........ 600/420 |
| 6,031,375 A | 2/2000 | Atalar et al. ................. 324/307 |
| 6,032,078 A | 2/2000 | Rudie ......................... 607/101 |
| 6,051,974 A | 4/2000 | Reisker et al. .............. 324/318 |
| 6,058,323 A | 5/2000 | Lemelson ................... 600/408 |
| 6,061,587 A | 5/2000 | Kucharczyk et al. ........ 600/411 |
| 6,078,831 A | 6/2000 | Belef et al. ................. 600/424 |
| 6,104,943 A | 8/2000 | Frederick et al. ............ 600/410 |
| 6,171,240 B1 | 1/2001 | Young et al. ................. 600/410 |
| 6,272,370 B1 | 8/2001 | Gillies et al. ................. 600/411 |
| 6,284,971 B1 | 9/2001 | Atalar et al. ................... 174/36 |
| 6,332,089 B1 | 12/2001 | Acker et al. ................. 600/424 |
| 6,351,124 B1 | 2/2002 | Vester et al. ................. 324/318 |
| 6,408,202 B1 | 6/2002 | Lima et al. .................. 600/423 |
| 6,606,513 B2 * | 8/2003 | Lardo et al. ................. 600/411 |
| 6,675,033 B1 * | 1/2004 | Lardo et al. ................. 600/410 |

FOREIGN PATENT DOCUMENTS

| | | |
|---|---|---|
| EP | 0 673 621 A1 | 9/1995 |
| EP | 0 768 539 A2 | 4/1997 |
| EP | 0 850 595 A1 | 7/1998 |
| EP | 0 908 739 A2 | 4/1999 |
| JP | 6-70902 | 3/1994 |
| WO | WO 98/52064 | 11/1998 |
| WO | WO 98/52461 | 11/1998 |
| WO | WO 99/18852 | 4/1999 |
| WO | WO 99/27390 | 6/1999 |
| WO | WO 99/59479 | 11/1999 |
| WO | WO 00/64003 | 10/2000 |

OTHER PUBLICATIONS

Edelman et al.; "Magnetic Resonance Imaging" NEJM. 328: 708-716 (1993).

Farmer et al.; "Implanted Coil MR Microscopy of RenalPathology", Magn. Reson. Med., 10:310-323 (1989).

Garwood et al.; "Magnetic Resonance Imaging with Adiabatic Using a Single Surface Coil for RF Transmission and Signal Detection", Magnetic Resonance in Medicine 9:25-34 (1989).

Hoult et al.; "The Signal-to-Noise Ratio of the Nuclear Magnetic Resonance Experiment" J. Magn. Reson., 24:71-85 (1976).

Hoult; "Rotating Frame Zeugmatography", Phil. Trans. R. Soc. Lond. B. 289:543-547 (1980).

Jolesz et al.; "Interventional Magnetic Resonance Therapy", Seminars in Interventional Radiology, 12:20-27 (1995).

Ocali et al.; "Intravascular Magnetic Resonance Imaging using a Loopless Catheter Antenna", MRM, 37:112-118 (1997).

Silverman et al.; "Interactive MR-guided Biopsy in an Open configuration MR Imaging System", Radiology, 197:175-181 (1995).

Ladd et al.; "Guidewire Antennas for MR Fluoroscopy", Magnetic Resonance in Medicine, Academic Press, Duluth, MN, US., vol. 37(6): 891-897, (Jun. 1, 1997).

Martin et al.; "An Expandable Intravenous RF Coil For Imaging the Artery Wall", Proceeding of the International Society For Magnetic Resonance In Medicine, Fourth Scientific Meeting and Exhibition, New York, USA Apr. 27-May 3, 1996, vol. 1, p. 402.

Quick et al; "Vascular Stents as RF-Antennas for Intravascular MR-Guidance and- Imaging", Proceedings of the International Society for Magnetic Resonance in Medicine, Seventh Scientific Meeting and Exhibition, Philadelphia, Pennsylvania, USA May 22-28, 1999, vol. 1, p. 577.

Lardo, A.C.; "Real-Time Magnetic Resonance Imaging: Diagnostic and Interventional Applications", Pediatric Cardiology, Springer-Verlag, NY, US., vol. 21, No. 1:80-98, (Jan. 2000).

Form PCT/ISA/210, International Search Report for PCT/US 01/03346 (Nov. 5, 2001), Applicant: Surgi-Vision, Inc.

International Search Report, PCT Application No. PCT/US 02/12867, mailed Aug. 21, 2002.

* cited by examiner

AXIAL MODE
$D > \lambda$

NORMAL MODE
$D \ll \lambda$

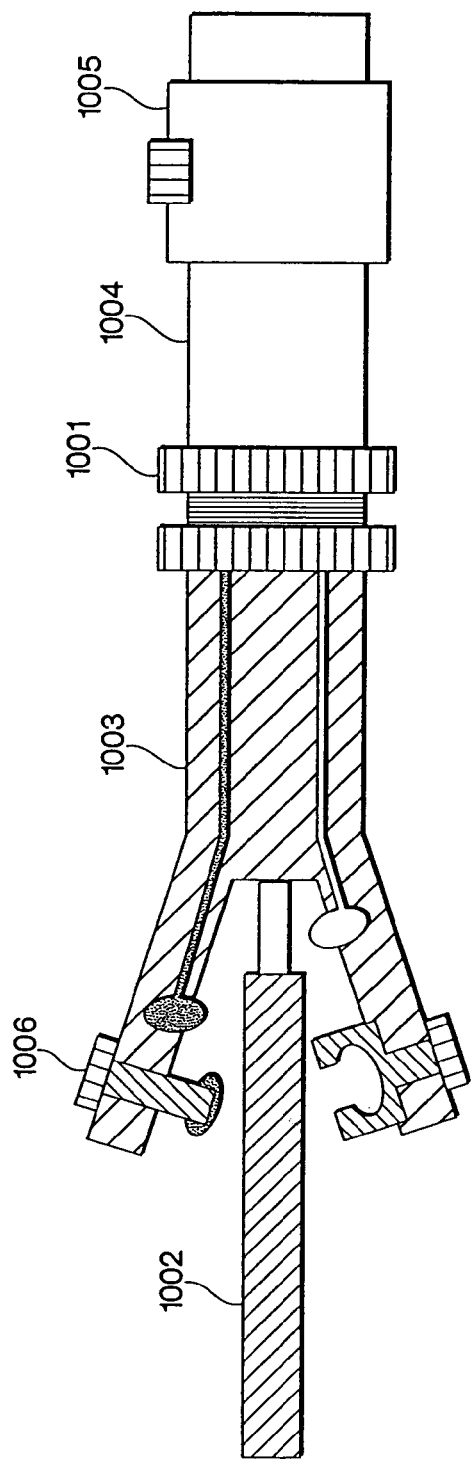
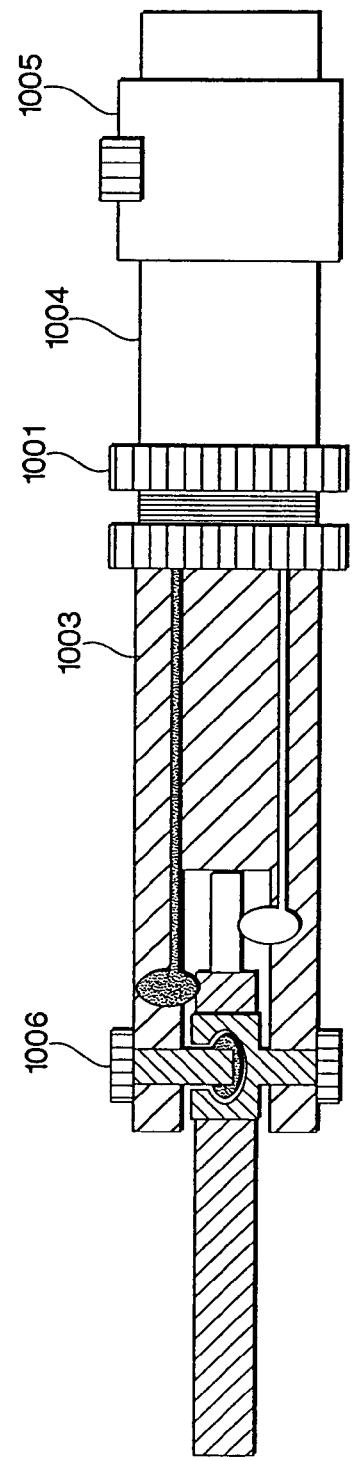
Fig. 18A
Fig. 18B

MAGNETIC RESONANCE IMAGING NEEDLE ANTENNAS

REFERENCE TO PRIOR APPLICATIONS

This application is a continuation of U.S. patent application Ser. No. 09/775,338, filed Feb. 1, 2001, now U.S. Pat. No. 6,606,513, which claims the benefit of U.S. Provisional Application Ser. No. 60,178,933, filed Feb. 1, 2000, and which is a continuation-in-part of U.S. patent application Ser. No. 09/536,090, filed Mar. 24, 2000, now U.S. Pat. No. 6,675,033, which claims priority to U.S. Provisional Application Ser. No. 60/129,364, filed Apr. 15, 1999. The entire disclosure of each application is hereby incorporated by reference.

BACKGROUND OF THE INVENTION

1. Field of the Invention

This invention relates to the field of radio frequency antennas. More particularly to the use of a radio frequency antenna as a transseptal needle for use in vivo in conjunction with magnetic resonance imaging techniques.

2. Description of Related Art

Magnetic resonance imaging (MRI) is a well known, highly useful technique for imaging matter. It has particular use with imaging the human body or other biological tissue without invasive procedures or exposure to the harmful radiation or chemicals present with x-rays or CT scans. MRI uses changes in the angular momentum or "spin" of atomic nuclei of certain elements to show locations of those elements within matter. In an MRI procedure, a subject is usually inserted into an imaging machine that contains a large static magnetic field generally on the order of 0.2 to 4 Tesla although machines with higher strength fields are being developed and used. This static magnetic field tends to cause the vector of the magnetization of the atomic nuclei placed therein to align with the magnetic field. The subject is then exposed to pulses of radio frequency (RF) energy in the form of a second, oscillating, RF magnetic field having a particular frequency referred to in the art as a resonant or Larmor frequency. This frequency is equal to the rate that the spins rotate or precess.

This second field is generally oriented so that its magnetic field is oriented in the transverse plane to that of the static magnetic field and is generally significantly smaller. The second field pulls the net magnetism of the atomic nuclei off the axis of the original magnetic field. As the second magnetic field pulses, it pulls the spins off axis. When it is turned off, the spins "relax" back to their position relative to the initial magnetic field. The rate at which the spins relax is dependent on the molecular level environment. During the relaxation step, the precessing magnetization at the Larmor frequency induces a signal voltage that can be detected by antennas tuned to that frequency. The magnetic resonance signal persists for the time it takes for the spin to relax. Since different tissues have different molecular level environments, the differences in relaxation times provides a mechanism for tissue contrast in MRI.

In order to image the magnetic resonance signal it is necessary to encode the locations of the resonant spins. This is performed by applying pulse of gradient magnetic fields to the main magnetic field in each of the three dimensions. By creating this field, the location of resonant nuclei can be determined because the nuclei will resonate at a different Larmor frequency since the magnetic field they experience differs from their neighbors. The magnetic resonance (MR) image is a representation of the magnetic resonance signal on a display in two or three dimensions. This display usually comprises slices taken on an axis of interest in the subject, or slices in any dimension or combination of dimensions, three-dimensional renderings including computer generated three-dimensional "blow-ups" of two-dimensional slices, or any combination of the previous, but can comprise any display known to the art.

MR signals are very weak and therefore the antenna's ability to detect them depends on both its size and its proximity to the source of those signals. In order to improve the signal of an MRI, the antenna may be placed near or inside the subject to be imaged. Such improvements can enable valuable increases in resolution sensitivity and reduction of scan time. It may be desirable to have evidence of the MRI antenna itself on the MRI to allow the individual inserting the MRI antenna to direct where it is going and to maneuver it with aid from the MR image. Such a benefit could be useful in medical procedures where MRI is used simultaneously to track the position of an intraluminal device and to evaluate the structures surrounding the lumen. For example, an intravascular catheter could be directed through a vessel using MRI to reach a targeted area of the vessel, and the MRI apparatus could further be used to delineate the intravascular anatomy or nearby tissue to determine whether a particular therapeutic intervention would be required. Using MRI to guide the catheter and using MRI further to map out the relevant anatomy and perform an intervention could complement conventional angiographic imaging technology within an interventional radiology or cardiology or minimally invasive imaging suite. Once the catheter is directed to the desired anatomic target under MR guidance, and once the topography or other relevant anatomy of the target lesion is depicted using MRI, the clinician can make decisions about what type of intervention would be indicated, if any, and where the intervention should be delivered.

Many conventional vascular interventional procedures use X-ray imaging technology in which transseptal needles and catheters are inserted into a vein or artery and navigated to specific locations in the heart for diagnostic and therapeutic procedures. Conventional X-ray guided vascular interventions, however, suffer from a number of limitations, including: (1) limited anatomical visualization of the body and blood vessels during the examination, (2) limited ability to obtain a cross-sectional view of the target vessel, (3) inability to characterize important pathologic features of atherosclerotic plaques, (4) limited ability to obtain functional information on the state of the related organ, and (5) exposure of the subject to potentially damaging x-ray radiation.

MRI techniques offer the potential to overcome these deficiencies. However, conventional transseptal needles are not suitable for use in MRI machines since they contain steel or magnetic materials that can cause significant image artifacts in an MRI machine and can cause injury to a patient from unintended motion due to effects of the magnetic fields or induced Ohmic heating. Even those antennae which have been fabricated for use inside a human body are not useful for many types of interventional procedures. Many of these devices are simply too large to be sufficiently miniaturized to fit in clinically used intravascular sheaths. Additionally, in order to be useful for procedures requiring loading of multiple tools during the procedure, it is desirable that the needle antenna be capable of loading multiple different tools after it has been placed in the subject.

X-ray fluoroscopy guided needle puncture of the atrial septum through the fossa ovalis was initially independently described in 1959 and modified by Brockenbrough and Braunwald one year later. This approach quickly became the preferred means of catheter access to the left heart and experienced widespread use for a number of diagnostic and therapeutic applications including assessment of mitral valve disease and creation of atrial septal defects in children with congenital heart disease. Although used widely, transseptal left heart catheterization was recognized to be extremely time consuming, technically demanding and associated with high number of potentially life threatening risks. These early experiences, along with the development of increasingly sophisticated interventional and noninvasive techniques for accessing left heart hemodynamics, diminished the impetus for transseptal catheterization and the procedure fell into relative disuse by the late 1970's.

More recently, transseptal catheterization has experienced a revival due to the development of percutaneous transvenous balloon mitral valvuloplasty and curative left atrial radiofrequency catheter ablation procedures. Fluoroscopy guided transseptal catheterization remains a technically difficult procedure, particularly in the setting of conditions that distort the normal atrial anatomy and the fluoroscopic position of the interatrial septum (e.g., atrial dilatation as is frequently encountered with mitral and/or tricuspid valve disease, aortic root dilatation, and hypertrophy of the interatrial septum). Associated complications of transseptal catheterization such as aortic, pulmonary artery and free wall atrial puncture can be serious and life threatening. Improvements in the technique and apparatus have yielded lower complication rates but even when performed by experienced operators, improper positioning of the device can result in cardiac or aortic perforation. Overall complication rates have been reported at 3 to 6%. ( ). With the decline in the use of transseptal techniques in diagnostic cardiology for assessment of valvular heart disease, there is likely to be a decreasing pool of experienced operators. Thus, increasing emphasis has been placed on vigilant, closely supervised training with emphasis placed upon properly identifying anatomic and catheter landmarks in the right atrium.

Over 3,000 transseptal procedures are performed each year in the United States for left sided radiofrequency ablation therapy and mitral valvoplasty procedures. Approximately 3-6% of these are complicated by aortic or atrial perforations due to incorrect needle positioning at the fossa ovalis. This relatively high complication rate can in part be attributed to the inability to directly visualize the fossa ovalis and other critical endocardial landmarks using a two-dimensional projection x-ray fluoroscopy.

MRI has several distinct advantages over x-ray fluoroscopy including, excellent soft-tissue contrast, the ability to define any tomographic plane and the absence of ionizing radiation exposure. In addition to these well-known general advantages, MRI offers several specific advantages that make it especially well suited for guiding transseptal puncture procedures including: 1) real-time interactive imaging, 2) direct visualization of critical endocardial anatomic landmarks, 3) direct high resolution imaging of the fossa ovalis, 4) visualization of the needle tip-tissue interface, 5) the ability to actively track needle position in three-dimensional space, and 6) elimination of radiation exposure. Despite this promise, MRI guided transseptal puncture has not been previously described. This can be most likely attributed to the many of the inherent challenges of therapeutic interventional cardiac MRI including device artifact, electromagnetic interference and the necessity for cardiac and respiratory gating and rapid imaging and display. The invention described herein describes a procedure and required hardware to perform MR guided transseptal puncture procedures with active needle tip tracking. Such a procedure and may have application in a number of interventional MRI guided therapies.

Previous studies demonstrated successful transseptal catheterization using transthoracic, transesophageal or intracardiac echocardiography. Each of these approaches, however, has significant practical and technical limitations. Transthoracic echocardiography lacks the resolution to accurately display the thin transseptal needle tip and single-plane images may provide misleading information regarding the position of the needle in three-dimensional space. In addition, x-ray fluoroscopy is required during imaging which may be logistically difficult, exposes the sonographer to radiation and may block fluoroscopic imaging. Transesophageal imaging with multi-plane probes improves spatial resolution considerably and thus overcomes some of these difficulties. While the needle tip can not be visualized, distention of the fossa immediately prior to perforation can be imaged. Transesophageal echocardiography guided procedures, however, are complicated by esophageal perforation or aspiration and the sedation required during prolonged esophageal intubation carries a risk of hypoventilation and limits communication with the patient during the procedure. Intracardiac echo guided has shown significant promise for guiding transseptal puncture procedures. Direct visualization of the fossa ovalis is possible and anatomic landmarks can be identified. Problems with this approach include, only limited views of the left and right atrium due to significant attenuation of sound at to high frequencies, the inability to distinguish multiple intracardiac catheters and the inability to track the needle tip and visualize fossa puncture. For these reasons, an alternative procedure would be desirable. MRI is not subject to these limitations and may be an ideal modality to guide transseptal puncture procedures. Recent published work has demonstrated that a complete electrophysiologic study can now be performed entirely under MRI guidance, including the ability to navigate catheters and characterize the temporal and spatial formation of ventricular radiofrequency ablation lesions in vivo. Additionally, MRI has been shown to guide mitral valvoplasty procedures. As these two therapies account for 95% of all transseptal procedures performed, it is clear that the ability to perform safe transseptal needle puncture under MRI guidance will be of great importance as the field of interventional cardiovascular MRI continues to evolve.

SUMMARY OF THE INVENTION

To solve the guidewire visualization problem, two approaches have been proposed: passive visualization, and active visualization. With the passive visualization approach, the material of the guidewires is modified so that the catheter appears bright or dark on MR images. Unfortunately, in these techniques data acquisition speed is often limited and the position of the guidewire cannot be visualized very accurately as it depends on the signal-to-noise ratio (SNR) of a second remote detector coil (antenna) which may be sub-optimal. In addition, the modification of the material may result in image artifacts distorting the view of neighboring tissue. In the active visualization techniques, the MRI signal is received by an antenna placed at the end of the guidewire that potentially provides high SNR and spatial resolution in the vicinity of the antenna. These types of probes have also presented problems for clinical applications, since the antennas are often difficult to insert, providing proper shielding from body fluids and tissues has been difficult, and avoiding injury to patients has at times required suboptimally sized probes to be used.

It is therefore desired in the art to produce a probe that contains an antenna suitable to receive and enhance MR images, that antenna providing signal that renders it visible on an MR image and suitable for use as a guidewire.

It is further desired by the art to provide an MRI probe which is constructed of flexible material that has sufficient mechanical properties to be suitable as a guidewire and suitable electrical properties to be an antenna for MRI images rendering it visible on an MR image.

It is further desired by the art to provide an MRI probe which uses multiple different shaped whip antenna designs to allow specific uses under certain circumstances, and which can be used in a clinical environment.

It is further desired by the art to provide an MRI probe that can act as a guidewire to multiple different interventional tools without having to remove the probe from the body to change between tools.

The invention disclosed herein in one embodiment comprises a system, method, and means for providing a flexible MRI probe assembly which is capable of receiving magnetic resonance signals from a subject and for functioning as a guidewire. To act as a guidewire, in one embodiment the MRI probe is small enough to insert into the guidewire lumen of an interventional device as is known to the art.

In a further embodiment of the current invention, the MRI probe is constructed using materials and designs that optimize mechanical properties for steerability, torque transmission and avoidance of antenna whip failure while maintaining desirable electromagnetic properties in magnetic susceptibly and electrical conductivity.

In a further embodiment of the current invention, the MRI probe's antenna whip is constructed to be flexible and therefore reduce the risk of chamber or vessel perforation.

In a further embodiment, the invention comprises a system, method, or means, whereby a guidewire probe suitable for use in an MRI machine can have multiple interventional tools switched between and guided by the guidewire probe without having to remove the probe from the subject. This is accomplished in one embodiment of the invention by the design and construction of a probe with a practical connection interface between the probe, the tuning/matching circuitry for tuning the antenna whip, and the MRI machine.

In a further embodiment, the invention provides a magnetic resonance antenna assembly for receiving magnetic resonance signals from a sample and for functioning as a guidewire, comprising a probe shaft including a core of non-magnetic material, a first insulator/dielectric layer for providing insulation, a shielding layer, a second insulator/dielectric layer, and an antenna whip. The core of non-magnetic material may be made of a super-elastic material, such as Nitinol or any other non-magnetic material whether metallic or non-metallic. The non-magnetic core may include a coating of conductive material which could comprise gold, silver, alternating layers of gold and silver or copper or aluminum, for example. A clip-on connector may be further provided for making an electrical connection to a magnetic resonance scanner, the clip-on connector enabling loading and unloading of interventional devices during a procedure without removal of the probe from the subject. The antenna whip may additionally comprise a linear whip, a helical whip, a tapered or a combination whip depending on the desired mechanical and electric properties of the antenna whip.

In one embodiment, the invention provides a transseptal needle system suitable from receiving magnetic resonance signals from a sample, comprising a hollow needle with a distal portion and a proximal portion, the distal portion having a distalmost end sharpened for penetrating a myocardial wall, and the needle further comprising a first conductor. The system further comprises an insulator/dielectric applied to cover the first conductor over the proximal portion of the needle and a second conductor applied to cover the insulator/dielectric. The methods of the present invention for visualizing an intrathoracic region of interest using MRI techniques may include the steps of providing a needle system comprising a hollow needle with a distal portion and a proximal portion, the distal portion having a distalmost end sharpened for penetrating a myocardial wall, and the needle further comprising a first conductor, and further comprising an insulator/dielectric applied to cover the first conductor over the proximal portion of the needle and a second conductor applied to cover the insulator/dielectric, directing the needle system into proximity to a myocardial wall, tracking progress of the needle system using active MRI tracking, penetrating the myocardial wall to approach the intrathoracic region of interest, and using the needle system as an MRI antenna to receive magnetic resonance signals from the intrathoracic region of interest.

BRIEF DESCRIPTION OF THE DRAWINGS

Other objects, features, and advantages of the invention will be apparent from the following detailed description of the preferred embodiments as illustrated in the accompanying drawings, in which reference characters refer to the same parts throughout the various views. The drawings are not necessarily to scale, emphasis being placed upon illustrating principles of the invention.

FIG. 18 shows a clip connector of the instant invention. 18A is in unlocked form and 18B is in locked form.

DETAILED DESCRIPTION

Figure 1:
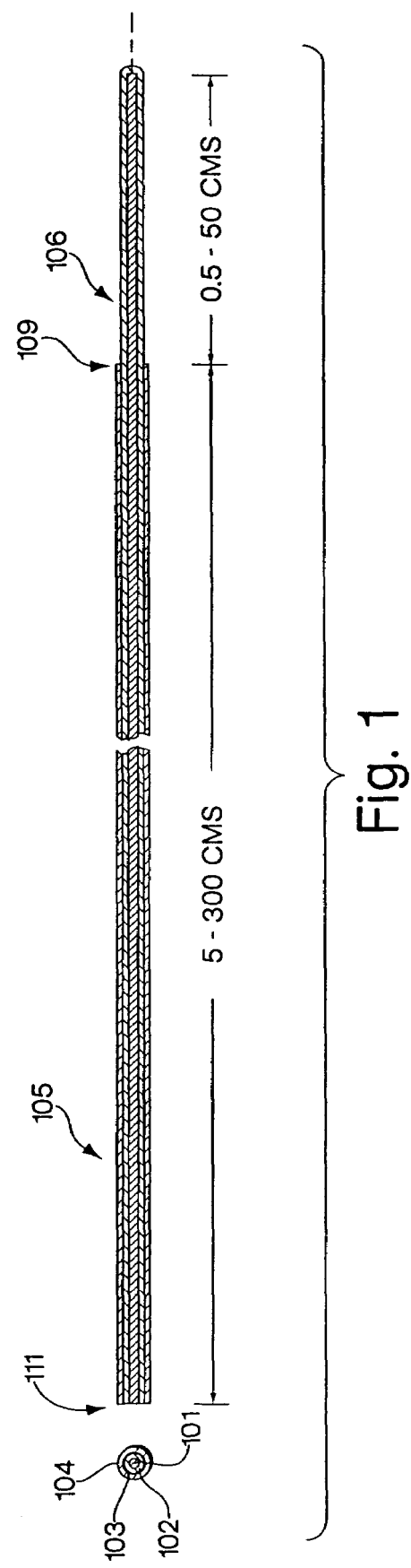
FIG. 1 shows a cross-sectional side and end view illustrating the structure of a guidewire probe with a linear whip antenna according to the invention.

This disclosure will discuss the invention primarily in terms of a loopless whip antenna for use with a guidewire probe that is suitable for vascular procedures on human subjects in a conventional MRI machine designed for medical use. This description does not, however, limit the scope of this invention. In particular, the invention can comprise any type of probe with any type of MRI antenna whether a whip antenna or not and whether of looped, loopless or of other design which is suitable for use as a guidewire as is understood in the art. The invention can also comprise any type of probe or other device for insertion into a subject, whether or not for use as a guidewire, that comprises a helical coil being used as an antenna. This includes, but is not limited to; any type of biopsy device; any type of interventional tool; any type of probe or device which could be used simultaneously to an interventional tool; any type of catheter, known now or later discovered, including, but not limited to, catheters for any use associated with endovascular, urinary, nasogastric, endotrachial, endobilliary, peritoneal, intracranial, intradural, intraarticular, urologic, nasopharyngeal (including endonasal approaches to the cella turcica) procedures; any type of probe, known now or later discovered, including, but not limited to, probes for any use associated with endovascular, urinary, nasogastric, endotrachial, endobilliary, peritoneal, intracranial, intradural, intraarticular, urologic, nasopharyngeal (including endonasal approaches to the cella turcica) procedures; any type of tube including, but not limited to, a jejeunostomy tube, a gastrostomy tube, colostomy tube, or a nephrostomy tube; any other type of intrabiological device; any type of device for use within non-biological matter; or any of the previous in any combination.

The subject of the invention is also not limited to human beings but can be used on any subject where the use of a guidewire is desired. These include but are not limited to, applications of the probe in the body or portion of the body of any human, non-human animal, or other biological organism, living, deceased or otherwise; applications involving placement of the probe in any fluid, gel, solid, gas, plasma or other state of matter where the use of a guidewire is desired in that matter, placing the probe in the vicinity of a portion of a subject for the purpose of viewing that portion of that subject through the probe's proximity, or guiding a device to within that portion's proximity; the use of a probe to simultaneously guide an interventional device and image the area on which the interventional device is to be used; or any of the previous in any combination.

The invention is also not limited to a conventional MRI machine used medically but can be used in any type of scanning device that can measure magnetic resonance. Therefore, we use the term MRI machine to apply to any type of machine, device, system, means, or process which allows the detection of magnetic resonance in any type or state of matter, such device being currently known or later developed, whether for use on humans, non-human animals, other biological organisms, biological tissues or samples, or inorganic matter. Such an MRI machine may be of any shape and for scanning any size subject or portion of a subject.

The application of guidewires is also not limited to vascular interventions. Guidewires are commonly used in many non-vascular applications for the placement of various probes and catheters into the gastrointestinal (GI) tract, the biliary duct, the urethra, bladder, ureter and other orifices, punctures, or surgical openings. Systems according to the present invention may be adapted to a plurality of minimally invasive applications. Guidewires according to the present invention may, in certain embodiments, be used for passage into and through the upper airway, trachea and bronchial tree. Examination of these structures using the systems of the present invention may be performed to detect abnormalities of the lungs or tracheobronchial tree, ideally at an early stage for early treatment. As an example, the early detection of a pre-malignant lesion in the tracheobronchial tree could permit early extirpation before an invasive cancer develops; even if an invasive cancer is detected, it may be possible to detect and treat these lesions at their earliest stages, before lymph node invasion or distant metastasis. Similarly, the systems and methods of the present invention are applicable to any body lumen or body cavity wherein early detection of pre-malignant and malignant disease is desirable. As examples, these systems and methods could be used for the evaluation of the esophagus, stomach and biliary tree to identify neoplasms and to distinguish benign from malignant tissue proliferation. As examples, these systems and methods could be used for the evaluation of the colon and rectum to identify abnormalities and malignancies. These systems and methods could also be used for the evaluation of the male and female urogenital systems, including bladder, urethra, prostate, uterus, cervix and ovary, to identify therein abnormalities and malignancies.

Further, the diagnostic function of the MRI would be useful in the evaluation of any mucosal malignancy to identify how far through the wall of the affected organ the malignancy has invaded. It is understood in the art that extent of invasiveness into and through the wall, diagnosable by MRI, is an important characteristic of an intraluminal cancer.

The diagnostic function of the MRI, as the probe is guided to the target tissue, may be combined with therapeutic interventions. For example, a small lesion found within a body lumen using the systems and methods of the present invention may be suitable for localized ablation, wherein the lesion's response to the delivery of radio frequency energy or other ablative energy can be monitored in near real time by the high resolution MRI as disclosed herein.

The scale of the devices described herein may be dimensionally adaptable to a number of body cavities and lumens traditionally inaccessible to interventive methods known in the prior art. For example, the eustachian tube, the nasal airways and the craniofacial sinuses may all be accessible to a probe designed in accordance with the present disclosure. Using one of these orifices as an entryway into the craniofacial skeleton may permit the diagnosis or evaluation of a variety of otolaryngological and neurological conditions with greater precision than is currently available using whole-patient CT or MRI. As an example, transsphenoid evaluation of intracranial or sellar lesions may be possible. The imaging of these lesions provided by the systems and methods of the present invention may be combined with therapeutic techniques for extirpating or otherwise treating the lesion using minimally invasive technologies. For example, an aneurysm of the Circle of Willis that is identified using high-resolution MRI may be suitable for clipping under MRI guidance using minimally invasive techniques. As another example, a pituitary tumor can be evaluated for its extensiveness using these systems and methods, and its resection can be precisely monitored. Use of these systems and methods may also permit diagnosis of abnormalities in organs considered inaccessible to traditional monitoring methods. For example, the pancreas may be examined, using an embodiment of the present invention, permitting the early diagnosis of pancreatic lesions. As another example, embodiments of the present invention may be adapted for intracranial use, for the diagnosis of lesions of the central nervous system or for precise anatomic delineation thereof. Ablative techniques may be combined with these diagnostic modalities to permit treatment of abnormalities using embodiments of the present invention to help determine the extent of the pathology and to monitor the effectiveness of the ablation in removing the abnormality. Trigeminal neuralgia is an example of a condition where delineation of the relevant intracranial anatomy is vital for the identification of the neuroanatomical structures to be ablated or treated. MRI using the systems and methods of the present invention may usefully help direct the surgeon to the precise tissues requiring treatment.

Conventional minimally invasive techniques such as laparoscopy, thoracoscopy, mediastinoscopy, and arthroscopy may all be combined with these systems and methods to permit more accurate identification of target lesions and to monitor therapies directed at the target lesions. MRI guidance according to these systems and methods may be particularly valuable in determining the extensiveness of a lesion that is to be resected or biopsied. For example, in mediastinoscopy, it may be difficult to distinguish between large blood-filled vessels and pathological lymph nodes, the latter being the target for the biopsy being performed. The operator performing the procedure must sample the pathological lymph nodes without damaging the large vessels in the area, an inadvertancy that can result in profound, even exsanguinating hemorrhage. MRI guidance according to these systems and methods can not only distinguish among the various types of anatomic structures, but also can map out the extent of lymph node involvement and direct the operator towards those lymph nodes most likely to bear the abnormal tissue being sought. A number of applications will be readily apparent to practitioners of ordinary skill in the art, whereby a conventional endoscopy procedure combined with these systems and methods will permit the diagnostic evaluation of a tissue or organ within a body lumen or a body cavity. The intraperitoneal space, for example, may be usefully evaluated using these systems and methods, with access to this space being provided by laparoscopic instrumentation, and with MRI being used to approach and identify target tissues. Intraperitoneal diagnosis using these systems and methods may be helpful in diagnosis of various retroperitoneal lymphadenopathies, such as those indicative of lymphoma, or such as those indicative of spread from a malignant melanoma of the lower extremity. Other examples may be evident to ordinarily skilled practitioners in the medical arts.

Combining these systems and methods with other diagnostic modalities may permit better or earlier diagnosis of malignancies. For example, use of contrast agents in addition to the systems and methods described herein may permit identification of tumors on the basis of their abnormal blood flow or metabolism. Contrast agents or other markers carried by body fluids may permit these systems and methods to be used for diagnosis of abnormal bleeding sites, such as occult gastrointestinal bleeding points or bleeding varices, situations where direct visual inspection of the lesion may have limited diagnostic or therapeutic value.

It is understood that advances in fabrication of static MRI machines will permit more localized anatomic evaluation of specialized body parts, and further will permit easier access to the patient for interventional techniques. These developments may permit the systems and methods of the present invention to be used as a replacement for various ultrasound-guided techniques such as fertility procedures. In certain embodiments, the present invention may be adapted for screening procedures using probes dimensionally adapted for appropriate bodily orifices. For example, these systems and methods may be useful in identifying and determining extensiveness of gynecological cancers, including cervical cancer, uterine cancer and ovarian cancer. Other applications should become available to practitioners of ordinary skill in the art with no more than routine experimentation.

The probe of this invention can be described and understood as having multiple different forms of antenna whip and design. The first of which is depicted in FIG. 1 wherein the probe comprises a linear whip antenna 106.

Figure 2:
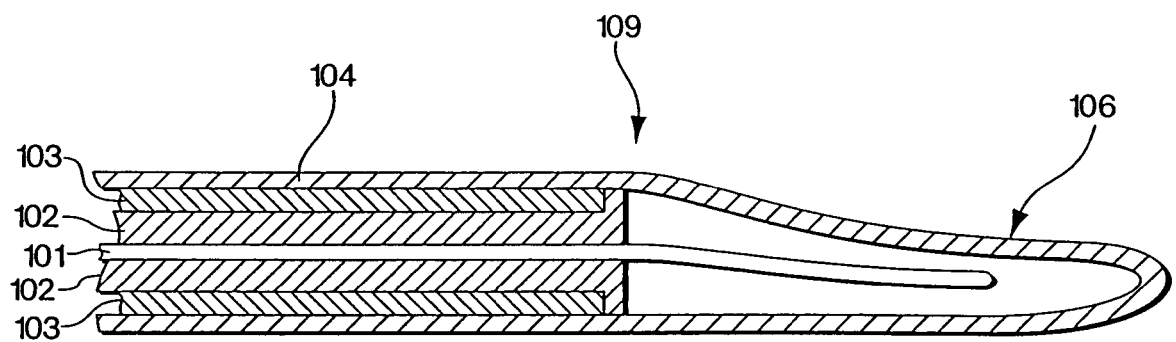
FIG. 2 shows a cross-sectional side view illustrating the structure of one potential shielded linear whip antenna according to the invention.
Figure 3:
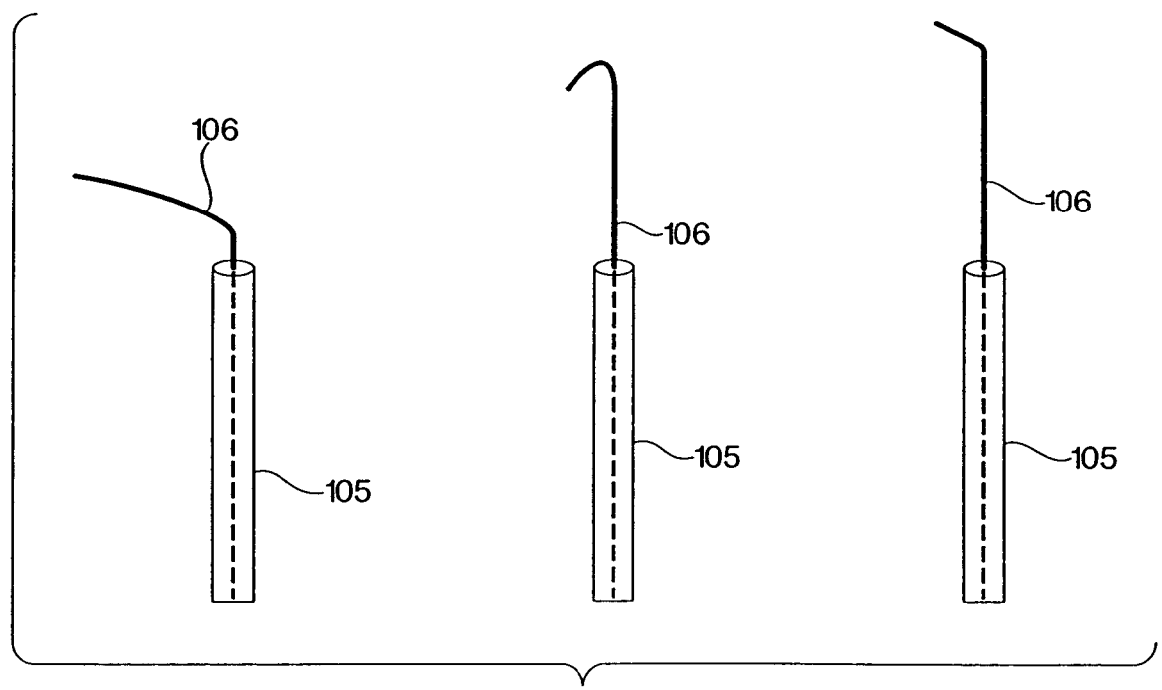
FIG. 3 shows three potential alternate shapes for a linear whip antenna.

The whip refers to the antenna at the end of the probe which is a whip antenna. In this case the whip comprises a primarily unbent protrusion and is therefore called a linear whip antenna 106. The probe preferably comprises a probe shaft 105 with a distal end 109 and a proximate end 111. The probe shaft can be comprised of multiple layers of different materials including a core 101 having at least one first electrically conducting component, a first insulator/dielectric 102 for providing insulation, a shielding 103 having at least one second conducting component, and an optional second insulator/dielectric 104 as shown in FIG. 2. The linear whip antenna 106 extends from the distal end 109 of the probe shaft 105. It would be understood that a linear whip antenna 106 does not have to be straight but may have a curve or slight hook at the end as is understood in the art to facilitate engagement of the device into complex vessels or other openings (such as ducts etc.) as shown in FIG. 3. In one embodiment of the invention, it would be understood that the linear whip antenna 106 would be straight or straight and flexible or could be bent to form other non-linear shapes as the probe was twisted through complicated pathways within the subject. In an alternative embodiment the linear whip antenna can comprise a ribbon or paddle shape such as those shown in FIG. 16.

The core 101 can comprise a super-elastic material such as the Tinol® range of materials (also known as Nitinol or NiTi). Super-elastics generally comprise a titanium-nickel alloy and have many positive attributes for use as a base for the probes of this invention. Super-elastics may be significantly deformed and still return to their original shape. Such deformation and "shape memory" can take place through actions based on changes in temperature. Super-elastic materials are also known for high biocompatability and show good properties for use within biological organisms or matter. Super-elastics in the antenna designs of this invention could be of any shape including wire, ribbon, microtubing, sheets or any other form as is known to the art but in one embodiment will comprise Nitinol wire that can be plated with layers of gold-silver-gold, or layers of gold, silver, copper, or aluminum applied either singly or in combination. The core 101 can alternatively comprise different materials, including, but not limited to, MR-compatible stainless steel, other metallic materials that are non-magnetic, non-metallic substances such as carbon, glass fiber, or polymer, that can be plated with a layer of a good RF conductor such as copper, silver, gold, or aluminum either singly or in multiple layers, or any of the previous in any combination. In the case of an aluminum core 101, the surface can be readily oxidized as is known to the art to provide the first insulator/dielectric 102.

The first insulator/dielectric 102 and the second insulator/dielectric 104, may comprise any insulator/dielectric as is known to the art including any polymer, such as, but not limited to, an elastomeric grade PEBAX, Nylon, Teflon®, polyurethane, fluoroethylene polymer (FEP), or polyvinylidene fluoride (PVDF), or any combination of polymers with appropriate electrical properties. The insulator/dielectric could also comprise aluminum oxide or any other non-polymeric element or compound as would be understood by one of skill in the art.

The thickness of the first insulator/dielectric 102 and the second optional insulator/dielectric 104 can be determined so as to control the impedance of the cable formed. The wire can have a uniform impedance throughout the length or the impedance can vary with length, for instance, by having low impedance closer to the proximate end 111 as compared to the distal end 109.

The shielding layer 103 may comprise any MR-compatible conductive material including, but not limited to, copper plated with silver, copper plated with gold, Nitinol plated with gold, conductive inks, conductive coatings or any of the previous in any combination. The shielding can be in the form of a braid, a mesh, or a continuous tubing such as, but not limited to, a gold-silver-gold plated Nitinol hypotube. The shielding can be continuous or coiled toward the distal end 109 and can extend beyond the distal end 109 of the probe shaft 105 or may be discontinued at the distal end 109 of the probe shaft 105. Discontinuing the shielding can create a stronger signal from the antenna, but may create detrimental effects when the probe is used in a human body.

Figure 4:
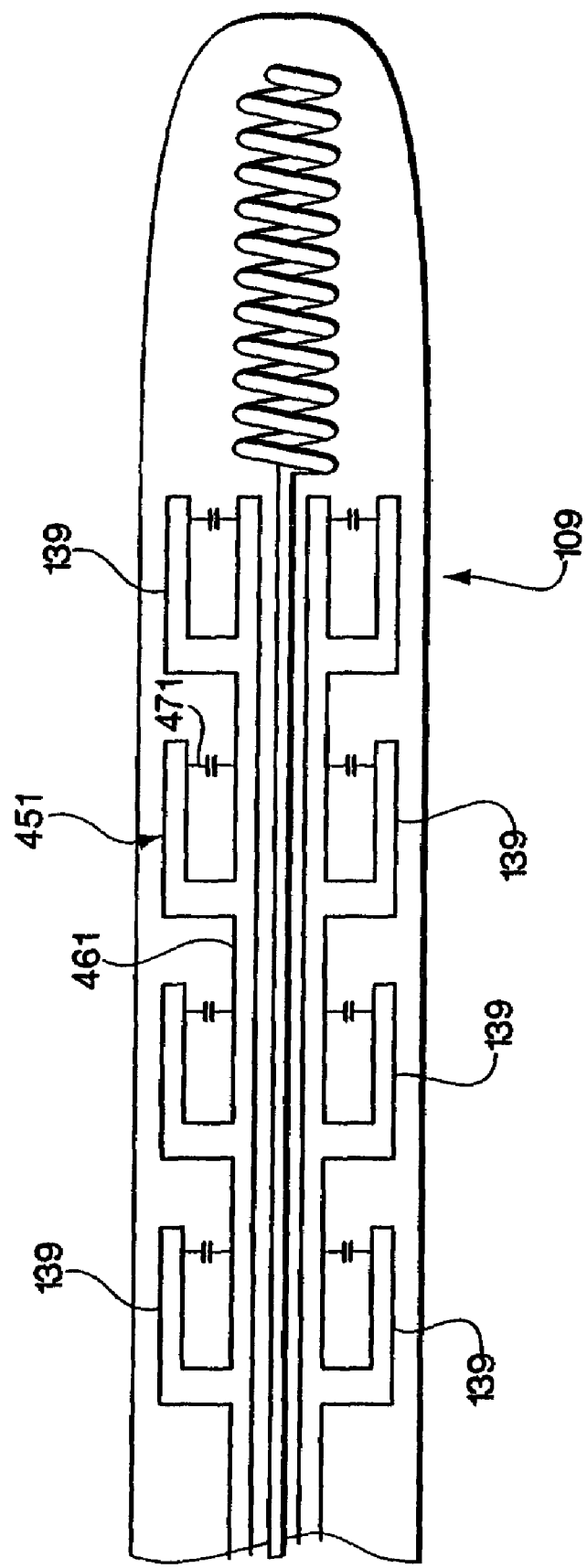
FIG. 4 shows a potential embodiment of the invention wherein the shielding comprises a series of balun circuits.

To increase the safety and the signal-to-noise ratio of the antenna, the shielding 103 can be added to the probe shaft in the form of a balun circuit as is understood in the art. This reduces the effect of induced currents due to external RF and magnetic fields. The tertiary shielding 451 can be continuous or discontinuous. It can have capacitors connecting the discontinuous sections or it can be connected directly to the primary shielding 461 or connected to the primary shielding 461 with capacitors 471 or by any other method understood in the art, or by a series of balun circuits 139 as shown in FIG. 4.

In another embodiment of the present invention, a balun circuit is placed on the probe in a tuned form (also known as a bazooka circuit) as is known to the art. This tuned balun circuit could help to increase the SNR performance and reduce the induced currents on the wire during an RF pulse transmission by any external RF coil (such as the transverse magnetic field in an MRI machine). This circuit may also decrease the risk of possible excessive Ohmic heating from the presence of the probe inside the body.

The second optional insulator/dielectric 104 is desirable over the antenna whip as depicted in FIG. 2 so as not to insert a straight cylindrical segment of bare wire into the patient with direct blood and tissue contact. The problem with this solution, however, is that the optimal length of the whip portion of the device is determined based upon the operating electromagnetic wavelength in vivo which in turn depend upon the effective dielectric constant as experienced by the antenna. For the case of a bare wire loaded in water, this length is approximately 4-12 cm, which represents a reasonable length for in vivo use. The addition of a second insulator/dielectric 104 to the outer surface of the antenna however, decreases the effective dielectric constant, which in turn increases the operating wavelength and thus increases the optimal whip length from 4-12 cm. It is clear that a significantly longer antenna whip may be unsuitable for some in vivo use, an alternative insulated whip design could be desired when the antenna is insulated as is discussed below. In addition, covering the antenna with a second insulator/dielectric 104 increases the diameter of the antenna making it increasingly difficult to insert in small vessels. In one embodiment, the linear whip antenna 106 has the narrowest possible diameter to allow such insertion.

A typical assembly procedure for an MRI probe of the present invention can involve the following steps. First, the first insulator/dielectric 102 is attached to a gold-silver-gold plated Nitinol core 101. This can be done by means of extrusion, drawing, a heat shrink tubing, or any other method known to the art. Next, the shielding 103 is loaded on the assembly leaving a portion of the assembly exposed to act as the linear whip antenna 106. This can be done by means of braiding, plating, painting, sputtering, or any other means known to the art. Alternatively, a metallic hypotube can be used instead of braiding to add mechanical stiffness to the probe shaft. Lastly, the second insulator/dielectric 104 is loaded on the probe shaft 105. A connector can then be attached to the proximate end 111 of the probe shaft 105 to facilitate connecting to the interface circuitry to be connected to the MRI scanner. The connector can be any type as is known to the art, or could alternatively be any of the connectors described below. In a further embodiment of the invention, the connector can be replaced by mechanical forming of the proximal tip to enable attachment of a snap-fit connector or by any other means of connections or termination of the probe as would be known to one of skill in the art. An optional coating of lubricant may further be added to the probe shaft 105 and/or antenna whip to reduce drag.

It is covered in this invention to manufacture the linear whip antenna 106 and probe shaft 105 as a single piece as is described above. Alternatively, the probe shaft 105 and linear whip antenna 106 could be constructed as two separate pieces and attached together by any means known to the art either permanently (including, but not limited to, use of high temperature or cold impact welding, soldering and/or electrically conducting glue or epoxy) or removeably (including, but not limited to, a snap-on or locking connection).

Figure 5:
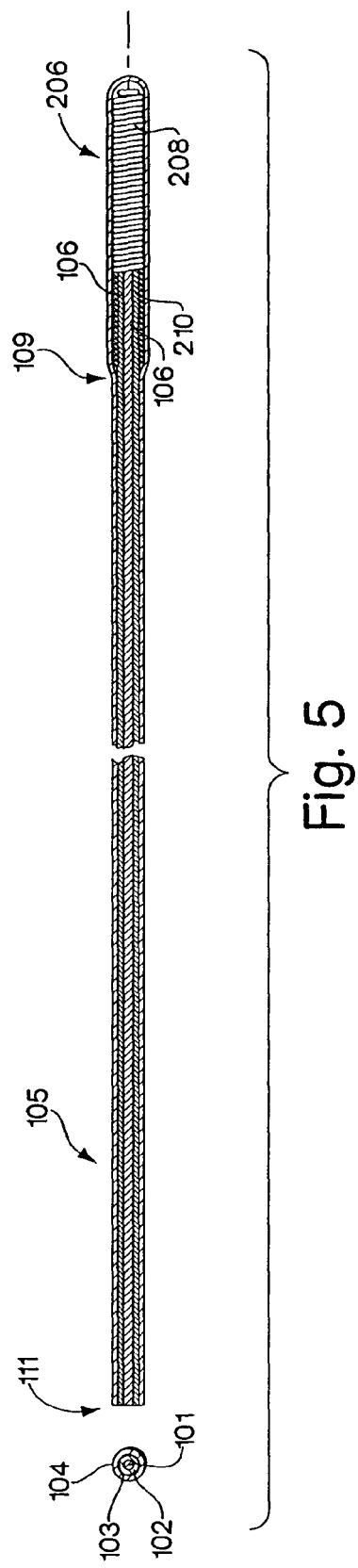
FIG. 5 shows a cross-sectional side and end view illustrating a guidewire probe according to an embodiment of the invention wherein the antenna whip comprises a combination whip where a helical coil is connected to a linear whip antenna at multiple points.
Figure 6:
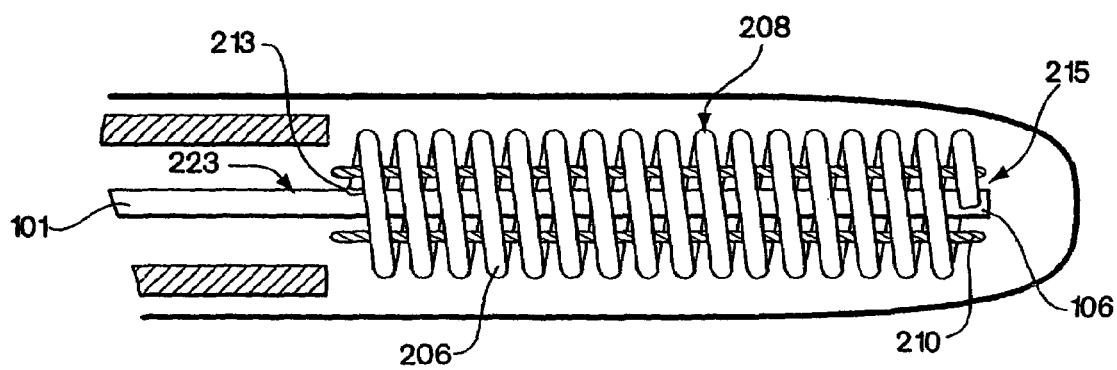
FIG. 6 shows a potential guidewire probe with a helical coil electronically connected to a linear whip antenna at a single point.
Figure 7:
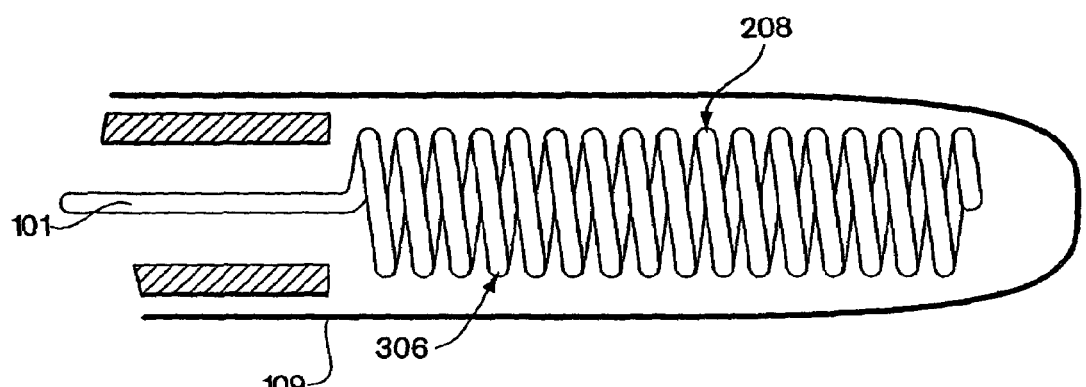
FIG. 7 shows a potential guidewire probe where a helical coil alone comprises a helical whip antenna.
Figure 9:
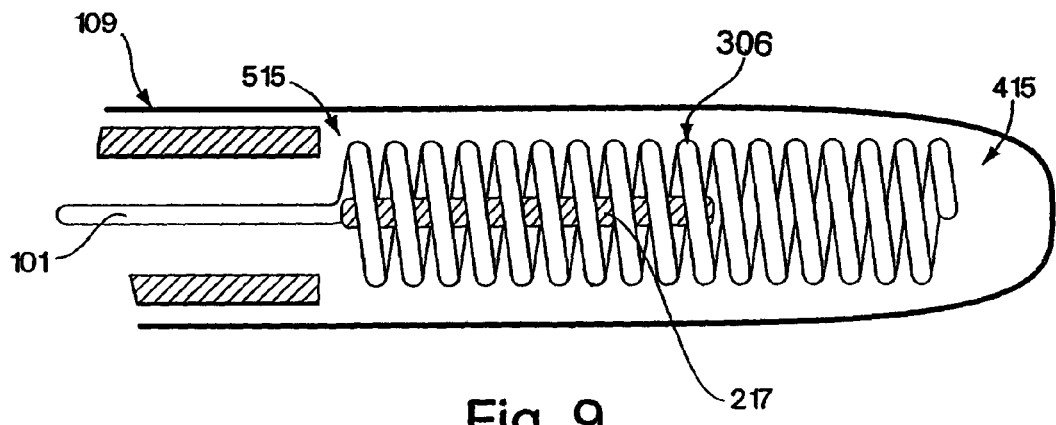
FIG. 9 shows a potential guidewire probe where a core is present inside a helical whip antenna.

FIGS. 5, 6, 7, and 9 show alternative embodiments of the invention using a helical coil antenna that obtains through its shape the ability to be the same physical length as a linear whip antenna, while still maintaining the electrical length of a much longer linear whip and therefore having desirable properties even when shielded by a second insulator/dielectric 104. FIGS. 5 and 6 show a combination whip antenna 206 where a helical coil is placed over and electrically joined to a linear whip antenna 101. FIG. 7 shows a guidewire probe with a helical coil whip antenna 306 where the helical coil 208 comprises the antenna alone. FIG. 9 shows a variation on the helical coil whip antenna 306 of FIG. 7 that contains a core 217 inside at least some of the coils of the helical coil 208. The core 217 can provide modification to the flexibility of the helical coil whip antenna 306 for insertion into, or navigation inside, a subject. The core 217 can be of non-conducting material including, but not limited to, a polymer, or can be an electrically conducting material. The core 217 will usually be non-magnetic.

Helically coiling the antenna shortens the physical antenna length while still producing optimum performance. Covering the antenna with an insulator, usually requires increasing the antenna length to obtain optimum performance because the insulator affects the ability of the antenna to detect signal. In this case, coiling the antenna can be used to compensate for this increase in antenna length. That is, a coil of wire can contain a longer piece of wire in a shorter physical form.

Figure 8:
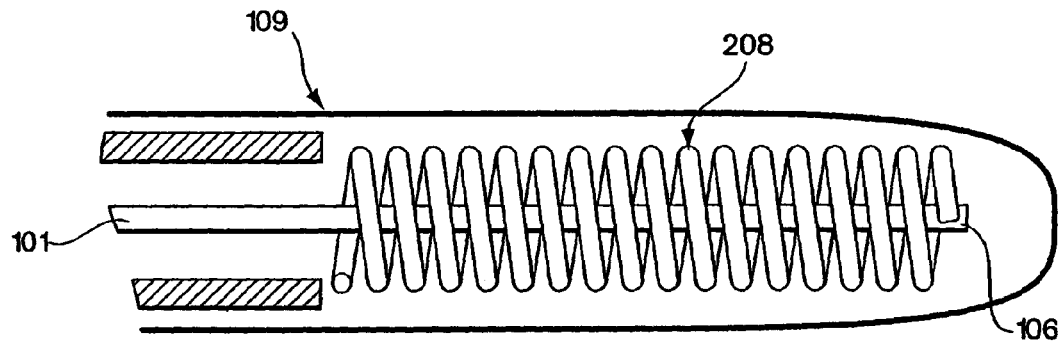
FIG. 8 shows a potential guidewire probe where a helical coil is placed over a linear whip antenna without making an electrical connection between the two.

A helical coil antenna has further mechanical advantages over a linear antenna. In physical form. particular, a coil is flexible and "springy" allowing it to navigate through complicated biological pathways without bending, kinking, or breaking, as opposed to a linear antenna which can have many of these problems since it is narrow and may have poor mechanical properties. Therefore, in one embodiment of this invention the helical coil is placed over a linear antenna, not necessarily to change signal, but to "superimpose" preferred mechanical properties on the linear antenna as exemplified in FIG. 8.

The helical coil also provides for detection of magnetic resonance in multiple directions. The signal received by a linear antenna is dependent upon the orientation of the antenna with respect to the main magnetic field as is known to the art. When a linear antenna design becomes bent or changes geometric planes, the sensitivity of the antenna and thus image quality can be degraded, with zero signal detected in some cases.

As diagnostic and therapeutic catheter interventions inherently involve movement of the catheter in planes transverse to the main longitudinal axis of the body, and therefore transverse to the magnetic fields in the MRI machine, an antenna design capable of removing this orientation dependency would be desirable in many cases. The unique physical geometry of the helical coil antenna allows detection of radio frequencies from two orthogonal components of the processing transverse magnetization, which is known as quadrature detection. Quadrature designs are able to create a circularly polarized electric field that results in a 50% reduction in RF power deposition and up to a 40% increase in signal to noise ratio. In addition to these very important advantages, such a design allows the imaging capabilities of the device to be independent of spatial orientation and therefore it can be used in any vessel or other area in the body.

Figure 10A:
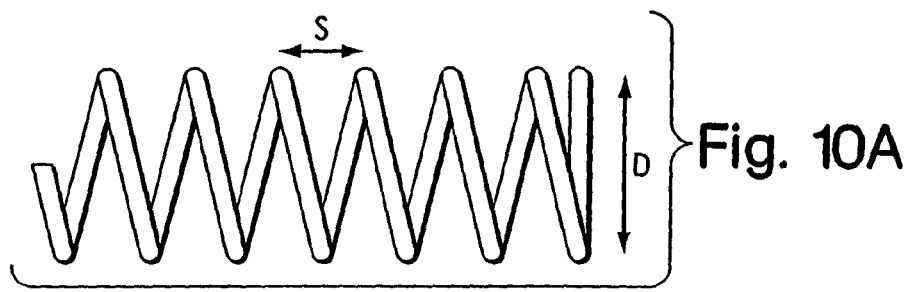
FIG. 10 shows a representation of the receiving properties of a helical coil antenna.
Figure 10B:
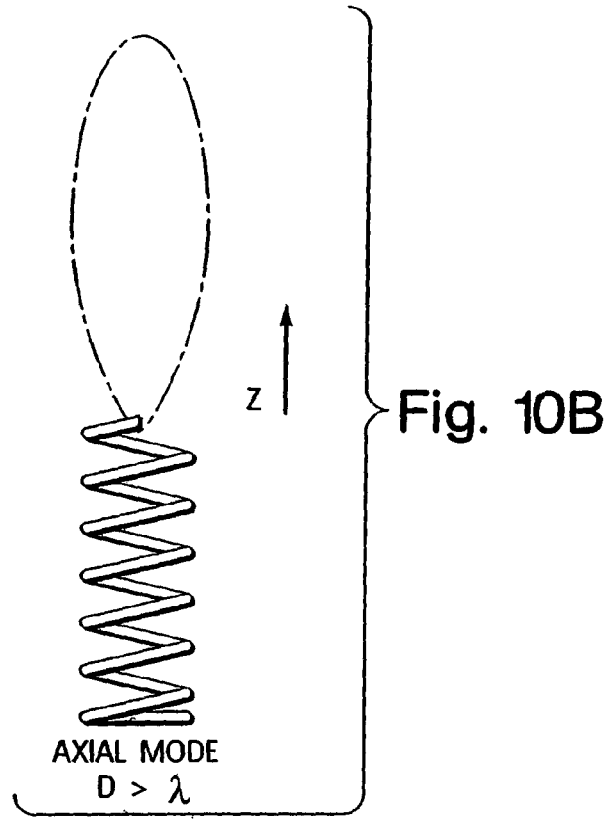
Figure 10C:
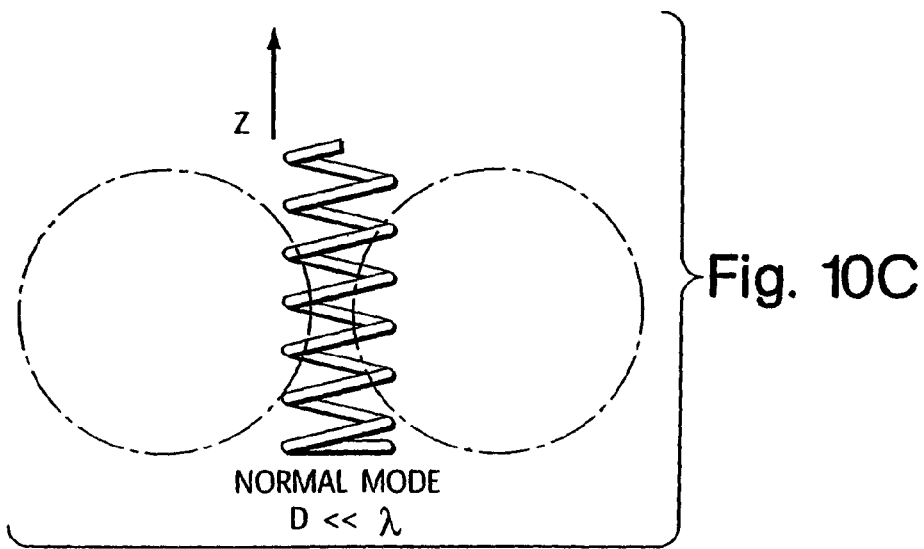

Helical coil antennas have two distinct and very different operating modes depending upon, as shown in FIG. 10, the physical dimensions of the windings and speed of wave propagation through the medium. When the diameter (D) and spacing (S) between the windings is comparable to the wavelength [1]$\lambda$ of the RF MRI signal to be detected with the coil inserted in the subject, (D$\lambda$=S$\lambda$=1, where D$\lambda$=helix diameter, S$\lambda$=coil spacing), the helical coil antenna operates in an end fire or axial mode, where polarization occurs primarily along the axis of the helix as depicted in FIG. 10(b). This is similar to the operation of the linear antenna. When D$\lambda$ and S$\lambda$ are much smaller than $\lambda$, the helical antenna is said to operate in normal mode where polarization occurs orthogonal or broadside to the helical axis as shown in FIG. 10(c) and described in equation (1). Since the RF frequencies used in MRI tend to be very long, normal mode operation is the standard for a probe of the present invention.

FIGS. 5 and 6 show a probe with a helical coil 208 on top of a linear whip antenna 106. This creates a combination whip antenna 206. In one embodiment of the present invention, there can be an electrical connection between the linear whip and the helical coil in one point 213 as shown in FIG. 6 or multiple points. Alternatively, the connection point could be at the distal end 215 of the linear whip antenna 106 instead of at the proximate end 223 as shown in FIG. 6. This allows for both portions to act as antennas and can produce an antenna with higher SNR without increasing physical size significantly. A thin insulator 210 may be placed between the linear whip antenna 106 and the helical coil 208 in any combination antenna 206. In another embodiment of the present invention (FIG. 8), the helical coil 208 and the linear whip antenna 106 are not electrically connected to each other. In this embodiment, the helical coil 208 provides beneficial mechanical properties to the linear whip antenna 106. In particular, it can make the linear whip antenna 106 more rugged and more flexible allowing for better mechanical properties within the subject. In FIGS. 5, 6 ,7, 8, and 9 the probe shaft 105 can be built similarly to the probe shaft of FIG. 1 and all listed materials for the probe of FIG. 1 are also available for the probes of FIGS. 5, 6, 7, 8, and 9. This type of construction is not limited to these figures. Any probe shaft 105 in any embodiment herein described may be constructed in a similar manner. In assembly, the helical coil 208 will generally be added to a preconstructed probe with a linear whip antenna 106. The addition can either complete the electrical connection to the helical coil 208 or not depending on the desired final probe. Alternatively the probe can be manufactured with the helical coil 208 already attached to the probe in any configuration.

In FIG. 7, the helical coil 208 comprises the entire helical coil whip antenna 306. In this depiction the helical coil 208 is electrically connected to the core 101 of the probe shaft 105. In this case, there is no linear whip antenna 106. Therefore, in another embodiment of the present invention, the whip is entirely helically coiled. This configuration can provide advantages in mechanical properties. In particular, the helical coil whip antenna 306 can be physically shorter or narrower than the combination whip antennas 206 depicted in FIGS. 5, 6, and 8 without significant loss of electrical length. In addition, since the helical coil whip antenna 306 has no linear portions and is only coiled, it is more flexible than any of the other antennas allowing it to turn sharper corners in the subject. Finally, the helical coil whip antenna 306 is more deformable than any of the previous antenna designs which makes the antenna less likely to puncture vessel walls. If desired, the flexibility of this antenna can be adjusted by including a core component 217 attached to the distal end 109 of the probe shaft 105 if nonconducting or unattached if conducting, as shown in FIG. 9. Core 217 need not extend to the distal end 415 of the helical coil whip antenna 306.

Figure 11:
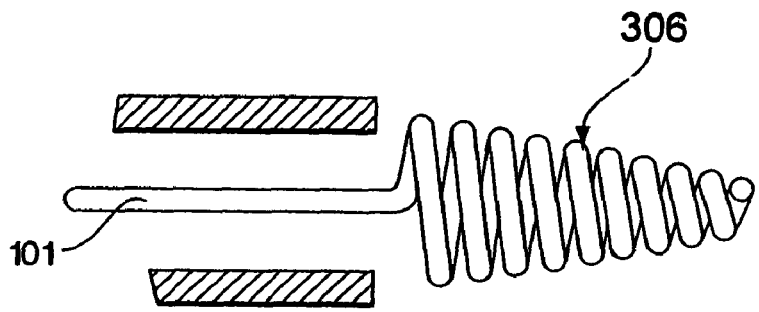
FIG. 11 shows a potential embodiment of a helical whip antenna where the diameter of the coils decreases from the proximate to the distal end of the helical whip antenna.
Figure 12:
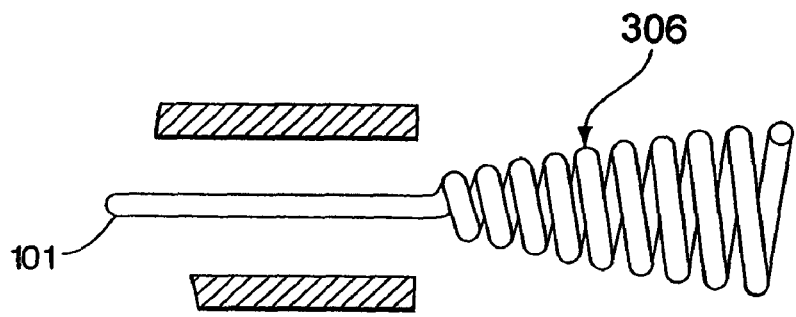
FIG. 12 shows a potential embodiment of a helical whip antenna where the diameter of the coils increases from the proximate to the distal end of the helical whip antenna.
Figure 13:
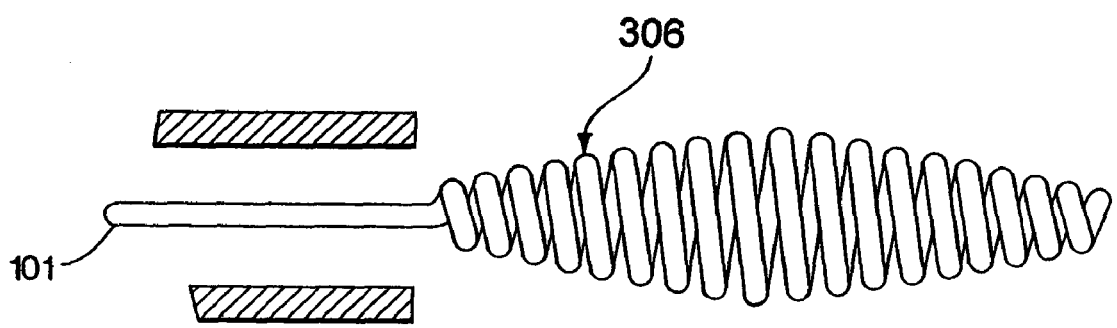
FIG. 13 shows a potential embodiment of a helical whip antenna where the diameter of the coils varies along the length of the helical coil antenna.
Figure 14:
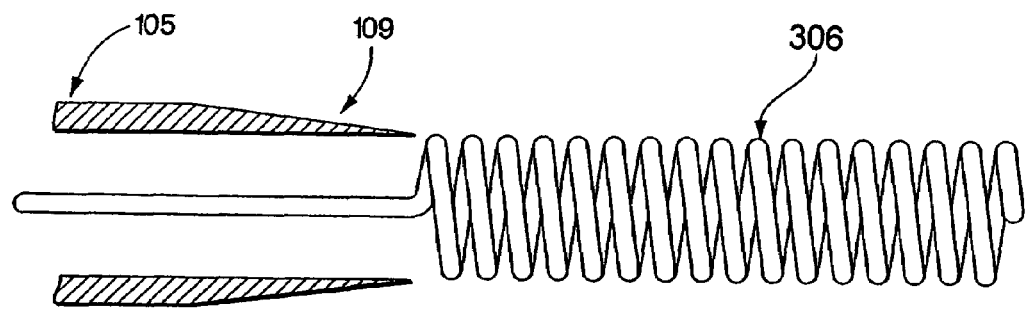
FIG. 14 shows one potential guidewire probe of the instant invention where the probe shaft decreases in diameter at its distal end.

FIGS. 11, 12 and 13 depict alternative embodiments of the helical coil whip antenna 306 that can be used in place of the whip designs shown in FIGS. 7 and 9. In FIG. 11, the helical coil whip antenna 306 has been tapered with decreasing diameter towards the distal end 415 to vary the flexibility of the whip such that it is more flexible at the tip to negotiate blood vessels and the like. In FIG. 12, the helical coil whip antenna 306 is tapered on the proximal end 515 to stiffen the flexibility at the distal end 415. In FIG. 13, the helical whip antenna 306 is tapered at both ends. The taper can be adjusted to provide the desired flexibility gradient. The taper can also repeat at regular intervals (either smoothly or at a sudden transition) or coils of different diameters can be placed anywhere within the length of the helical coil whip antenna 306. Alternatively, the distal end 109 of the probe shaft 105 can be tapered to improve the transition between the probe shaft 105 and any type of whip antenna (a helical coil whip antenna 306 is shown) as shown in FIG. 14.

In all of the variations of the designs, the optimum coil length may be preferably calculated or measured as the length that minimizes the real component of the impedance of the antenna as the impedance of the antenna is measured at the point where the shield ends. This length is usually around 0.25 or less times the electromagnetic wavelength of the RF MRI signal in the medium, but other lengths could be used as would be understood by one of skill in the art.

Figure 15:
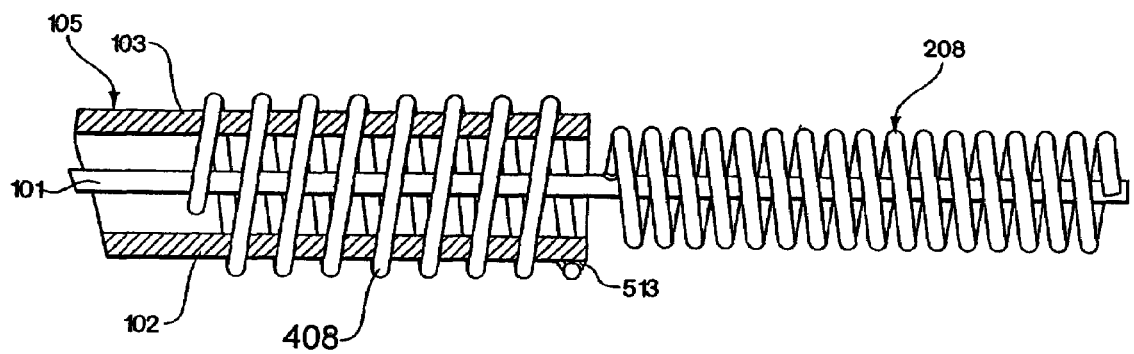
FIG. 15 shows an embodiment of the invention where a second helical coil is placed around the probe shaft and connected to the shielding.
Figure 16A:
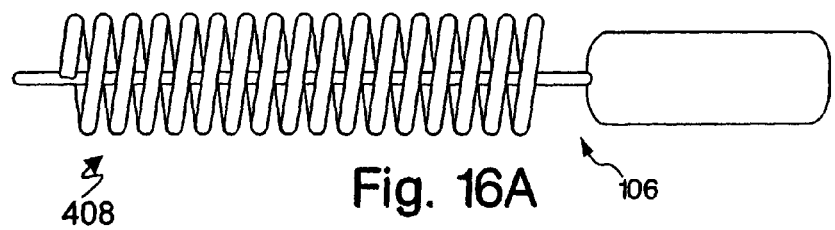
FIG. 16 show embodiments of the invention where a second helical coils is used as shielding around various whip antennas of the invention.
Figure 16B:
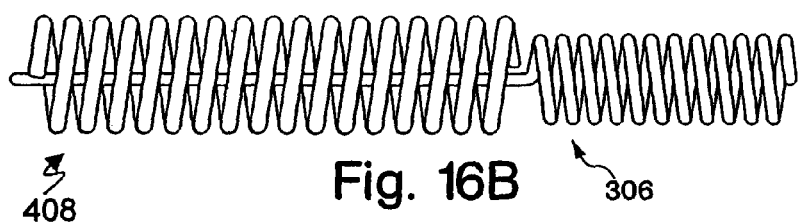
Figure 16C:
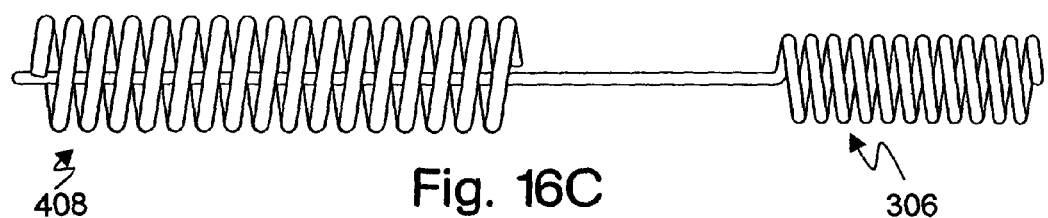
Figure 16D:
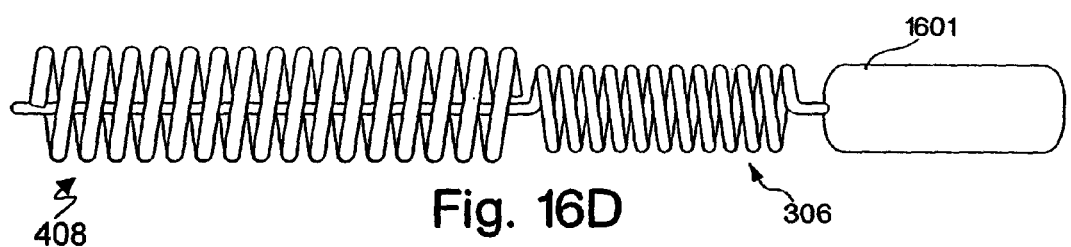

FIG. 15 shows yet another embodiment of the present invention, a second helical coil 408 is connected to the shielding 103 at point 513 of the probe shaft 105 to concentrate the MRI is signal sensitivity to a narrow range. The second helical coil 408 can also be connected to multiple points for multiple different electrical properties as would be understood by one of skill in the art. In further alternative embodiments, the shield 103 is completely or partially replaced by the second helical coil 408 which extends for the length of the shaft, insulated from the core 101 by dielectric 102. These arrangements can be used with any type of whip antenna including, but not limited to, those shown in FIG. 16. In particular, a linear whip antenna 106 as shown in FIGS. 16A and 16E, a helical coil whip antenna 306 with a separation between the outer shield and whip as shown in FIG. 16B, a helical coil whip antenna 306 without a separation between the outer shield and whip as shown in FIG. 16C or an alternate combination whip with a linear extension 1601 attached to a helical coil whip antenna 306 as shown in FIG. 16D, as well as with any of the other antenna whip designs and herein disclosed or otherwise known to one of skill in the art.

Figure 16E:
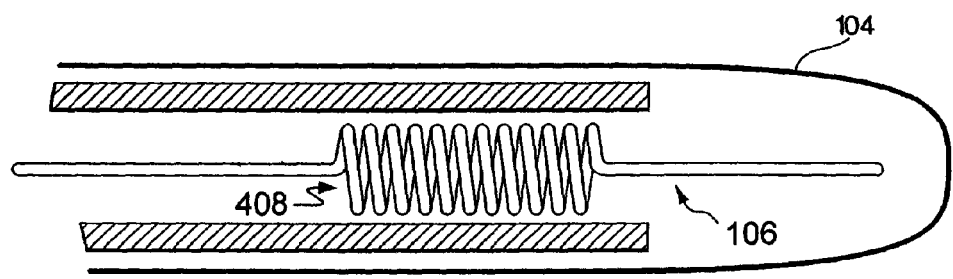

In further embodiments of the invention the second insulator/dielectric 104 is extended over the second helical coil 408 so as to provide protection to the subject from the antenna's interaction with exposed body fluids, tissues, or other portions of the subject as is depicted in FIG. 16E. The second helical coil 408 can also have any alterations of the coil's diameter or spacing along the second helical coil's 408 length as have been previously discussed with regards to the helical coil whip antenna 306.

The connection between this electronic circuit and the probe is a further portion of the invention because a standard RF BNC connector as is known to the art is not well suited for frequent connection and disconnection. In many current procedures where an MRI guidewire would be desired, the tools used as part of those procedures must be changeable without having to remove the guidewire from the subject. In one of the embodiments of the present invention, a connector is used to make an electrical connection between the probe and a tuning/matching and decoupling circuit or interface box of the present invention. This connector connects the interface to the antenna and can be removed and reinstalled as required during an interventional procedure to load and unload other interventional devices. FIGS. 17 through 25 show some examples of connectors of the present invention which are discussed in detail below.

Figure 26:
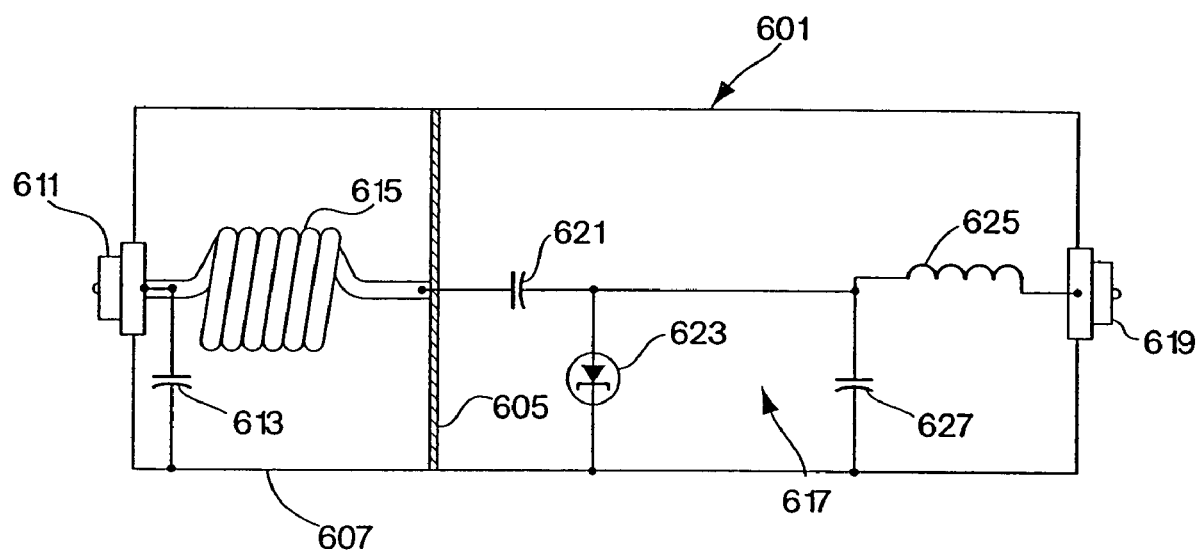
FIG. 26 shows a potential design of an interface box of the instant invention.

FIG. 26 shows one embodiment of an interface box for use between the MRI machine and the guidewire of the instant invention. One embodiment of the interface box consists of a shielded box 601 with two compartments 607 and 617, separated by a partition 605. In one embodiment, all components are non-magnetic. The probe attaches to coaxial connector 611 or another mating connector portion designed to attach to the connector portion of the probe. Coaxial connector 611 can be insulated from the interface box 601. The balancing of the dipole 611 is accomplished by capacitor 613 and coil 615. Coil 615 in one embodiment is a short length (5-10 cm) of 1 mm diameter solid-shield, 50 ohm coaxial cable, which is wound into a coil, increasing the inductance of both the center conductor as well as the shield. For the balancing function, it can be important to present a high impedance to current flow in the shielding 103 of the probe near the interface box 601. This high impedance is accomplished by tuning the LC circuit formed by capacitor 613 and the inductance of the shield of coil 615. In practice, capacitor 613 is selected such that the impedance of the network comprising capacitor 613 and coil 615 matches the impedance of the shielding 103 of the probe. The shield portion of the coaxial cable that forms coil 615 can be electrically connected to the partition 605 of the interface box 601 as shown in FIG. 26.

The center conductor of the coaxial cable that forms the coil 615 feeds through the partition 605 in the interface box 601. The inductance of the center conductor of the coil 615, and capacitor 613, form a tuned circuit that can decouple the probe from the imaging pulses of the MRI machine connected at a coaxial connector 619 (these imaging pulses usually occur at 63.9 MHz). Capacitor 621 can be tuned to maximize probe impedance when PIN diode 623 is turned on during imaging pulses. PIN diode 623 is turned on by a DC level being applied to co-axial connector 619 by the MRI scanner during MRI pulse transmission.

The probe can be tuned to match the generally 10 to 80 Ohm impedance of the MRI scanner amplifier by the network of inductor 625 and capacitor 627. This tuning can be accomplished by connecting a network analyzer to coaxial connector 617 and varying the value of the capacitor 627 until the measured impedance is the desired impedance at based on the frequency of the imaging pulses (usually 63.9 MHz). These numerical values are given as examples and in no way limit the choice of values that could be chosen in use of the invention.

The end of the guidewire antenna can contain a connector portion that allows radio frequency signals to propagate from the scanner to the guidewire antenna and vice versa by connecting the connector portion to a mated connector portion. The end of the transseptal needle antenna according to the present invention can, in like manner, contain a connector portion that allows radio frequency signals to propagate from the scanner to the transseptal needle antenna and vice versa by connecting the connector portion to a mated connector portion.

This connector can be a standard BNC connector or one of the special miniaturized connectors shown in FIGS. 17 through 25. The connectors allow for direct insertion of the guidewire into interventional devices such as balloon angioplasty catheter, stent placement devices. For this to be possible, the connector diameter should be no larger than guidewire probe diameter. Standard connector sizes, however, are often larger than the probe diameter and therefore do not allow for rapid exchanging of interventional devices over the guidewire probe. To overcome this difficulty, we show eight different connector configurations. Although many other designs are possible, the most important feature of these designs are that the diameter of the connector portion on the guidewire probe is not significantly larger than the diameter of the guidewire probe.

The connectors shown in FIGS. 17 through 20, 24, and 25 enable direct electrical contact between the conductors (shield and inner conductor of core) whereas the connectors shown in FIGS. 19-23 have no direct electrical contact.

Figure 17A:
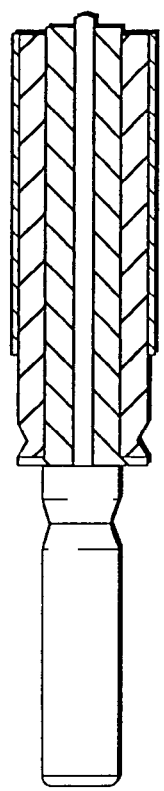
FIG. 17 shows a potential snap-on connector of the instant invention. 17A shows the male connector portion and 17B shows the female connector portion.
Figure 17B:
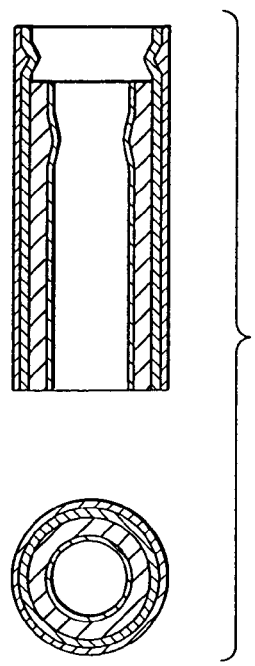

FIG. 17 shows a snap-on connector. The connector at FIG. 17A is the male connector portion. Its diameter is smaller or the same size as the diameter of the guidewire probe. FIG. 17B is the female mated connector portion. They are connected to each other with a small amount of pressure in the direction along the length of the connector and removed easily by pulling the connectors apart.

Figure 25:
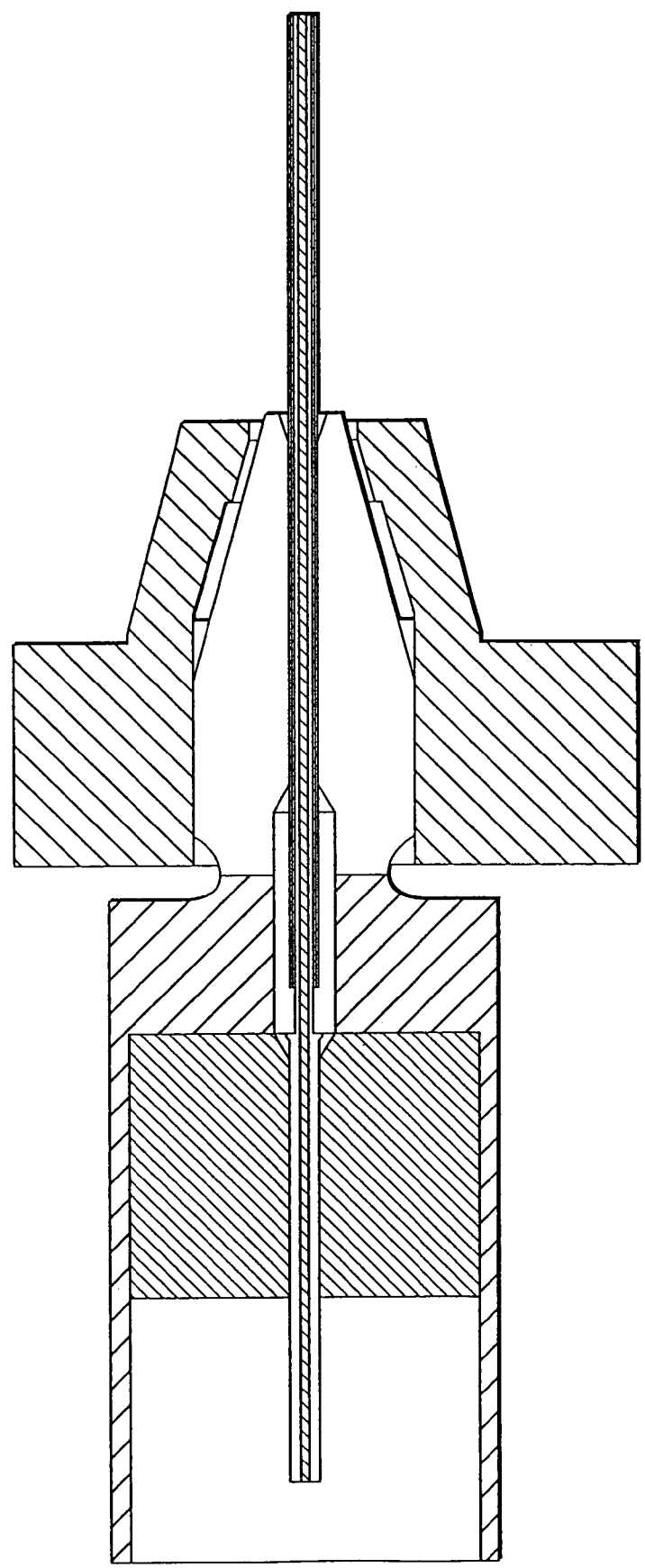

FIG. 18 shows a clip connector. The male connector portion's 1002 diameter is not larger than the diameter of the guidewire probe. With a clip lock mechanism, 1006, the female mated connector portion 1003 is connected to the male connector portion 1002. The mechanism shown by FIG. 18 enables free rotation of the connector. This enables the user to freely rotate the guidewire while it is connected. 1004 shows a coaxial cable connecting the interface box 1005 to the mated connector portion. FIGS. 24 and 25 show an alternative design of this type of connector wherein a vice-like connection is employed instead of the clip. Again this design allows for the guidewire to rotate freely while it is connected.

Figure 19:
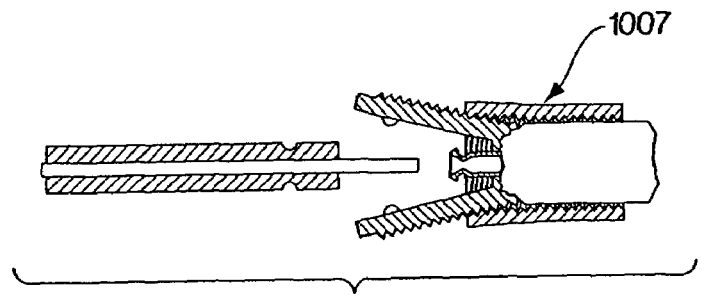
FIG. 19 shows a screw-lock connector of the instant invention.

FIG. 19 has the screw 1007 on the female mated connector portion that is an alternative to the clip lock mechanism, 1006 shown in FIG. 18.

Figure 20A:
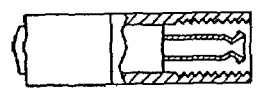
FIG. 20 shows a screw style connector of the instant invention. 20A shows the female portion and 20B shows the male portion.
Figure 20B:
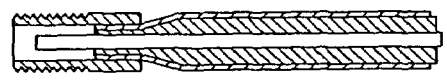

FIG. 20 shows another type of screw connector. FIG. 20A is the female connector portion that is a part of the guidewire probe. The male mated connector portion shown in FIG. 20B can be connected to a coaxial cable that leads to the interface box.

One problem with the connectors shown in FIGS. 17 through 20 is difficulty in using in a wet environment. When the connectors are wet or have blood or other body fluids on them, their performance may degrade. Therefore, a connector was designed that can be used in wet environment. The connectors shown in FIGS. 21-23 do not require direct electrical contact between the two connector portions.

Figure 21:
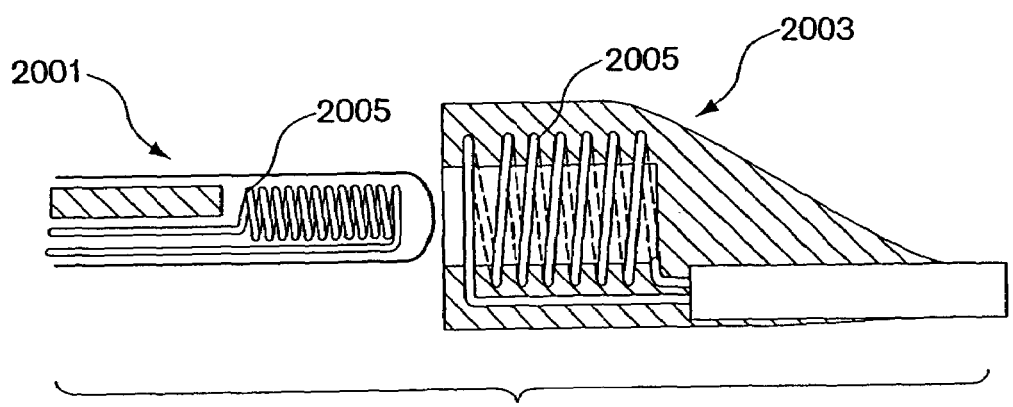
FIGS. 21-23 show alternate connectors whereby there is no direct electric contact between the male and female members of the connector.

FIG. 21 shows a selonidal coil 2005 inside both female and male connectors portions. The male connector portion snaps in the female mated connector portion 2003 but the electrical wires are not touching each other. The signal is transmitted from one to the other by the coupling of electromagnetic waves.

Figure 22:
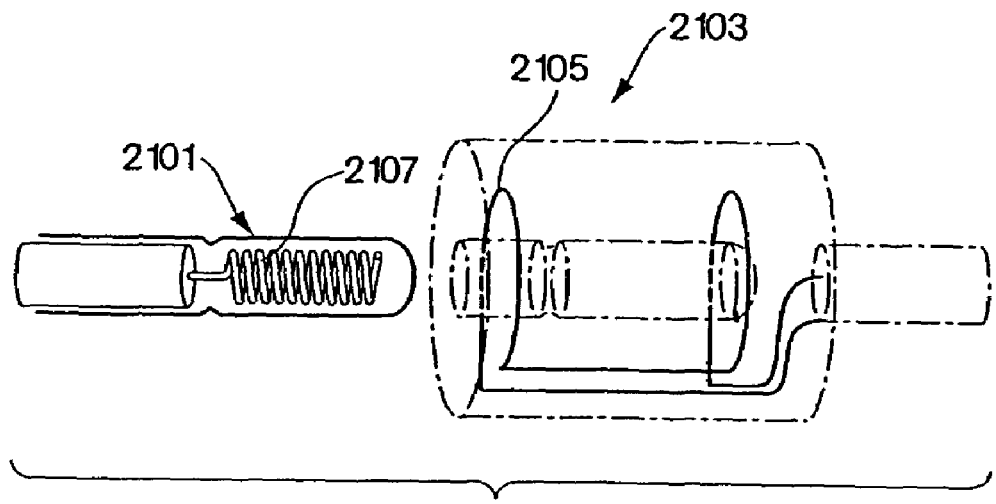

FIG. 22 shows a coaxial cable with extended inner conductor 2105 as the mated connector portion 2103 and an opposed selonidal coil 2107 as the connector portion 2101 on the guidewire probe.

Figure 23:
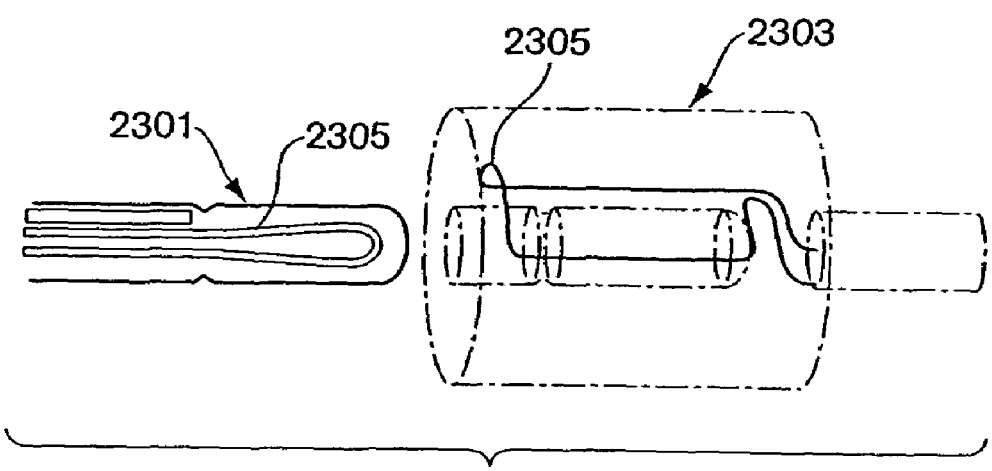
Figure 24A:
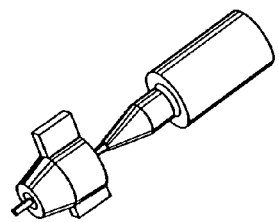
FIGS. 24 and 25 show different views of a connector of the instant invention which use a vice-like connector between the connector portion and the mated connector portion and allow the guidewire to rotate within the connector.
Figure 24B:
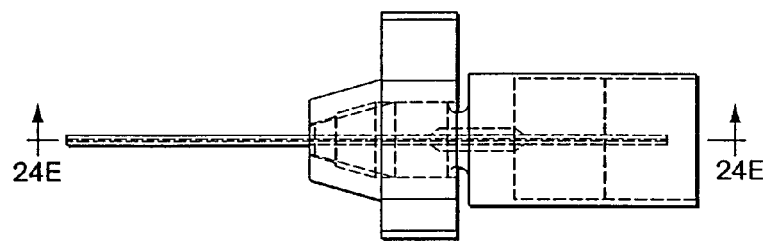
Figure 24C:
Figure 24D:
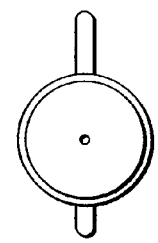
Figure 24E:
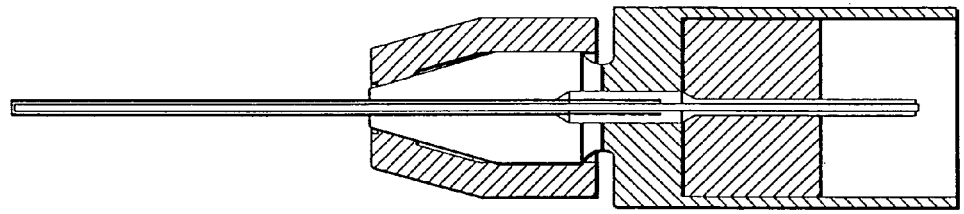

FIG. 23 shows a loop coil 2305 in both ends of the connector. As in the other, the male connector portion 2301 snaps on the female mated connector portion 2303. The electromagnetic waves are transmitted from one coil to the other enabling connection.

One further advantage of using these connectors (FIGS. 21-23) are the isolation of the circuits. Any direct current from one connector will not appear on the other.

Figure 27:
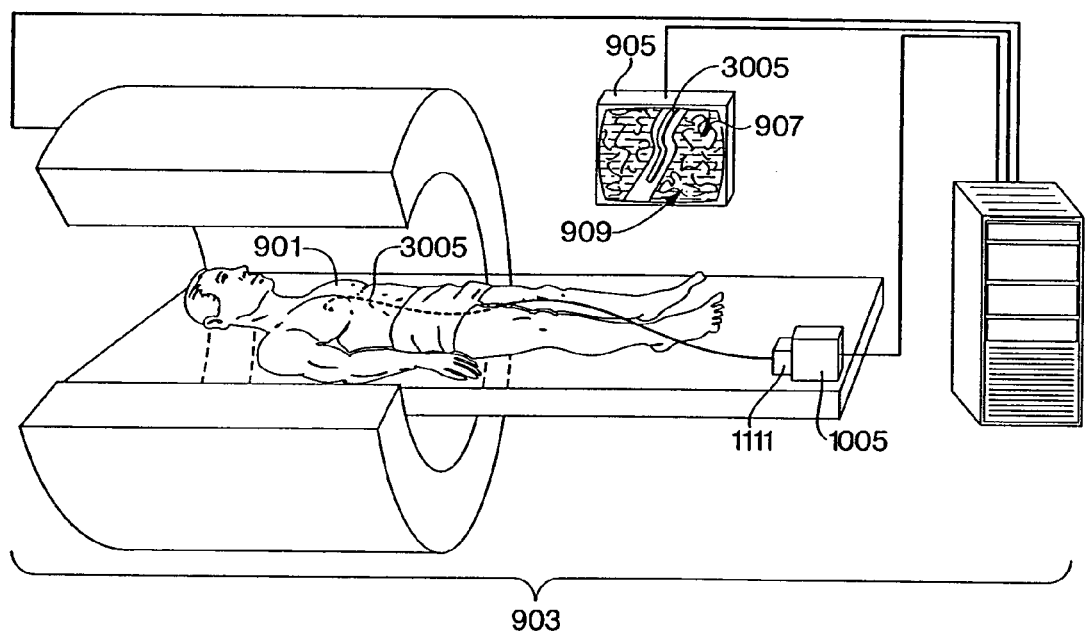
FIG. 27 shows a layout of a system of the instant invention wherein the guidewire probe might be used.

FIG. 27 shows one potential layout of a system whereby a guidewire probe could be used, or a system whereby a transseptal needle probe according to the present invention may be used. In this figure, the subject 901 is shown within the MRI machine 903. The probe 3005 has been inserted into the subject 901. A display 905 is showing an MRI 907 showing the probe 3005 and the surrounding biological tissue 909. The probe 3005 is connected to the interface box 1005 through a connector 1111 that will allow a doctor (not shown) or another individual or machine to load or unload tools without removing the probe 3005 from the subject 901. The interface box 1005 is connected to the MRI machine 903 allowing the MRI machine 903 to use the probe 3005 as an active antenna in the subject 901.

In one embodiment, the present invention relates to the use of a loopless whip antenna in conjunction with a transseptal needle probe that is suitable for intracardiac procedures on human subjects in a conventional MRI machine designed for medical use. This representative embodiment, however, should not be construed as limiting t the scope of this invention. In particular, the invention can comprise any type of probe with any type of MRI antenna whether of looped, loopless or of other design which is suitable for use as a transseptal needle as is understood in the art. This includes, but is not limited to; any type of biopsy device; any type of interventional tool; any type of probe or device which could be used simultaneously to an interventional tool; any type of catheter, known now or later discovered or any type of device for use within non-biological matter; or any of the previous in any combination.

Figure 28:
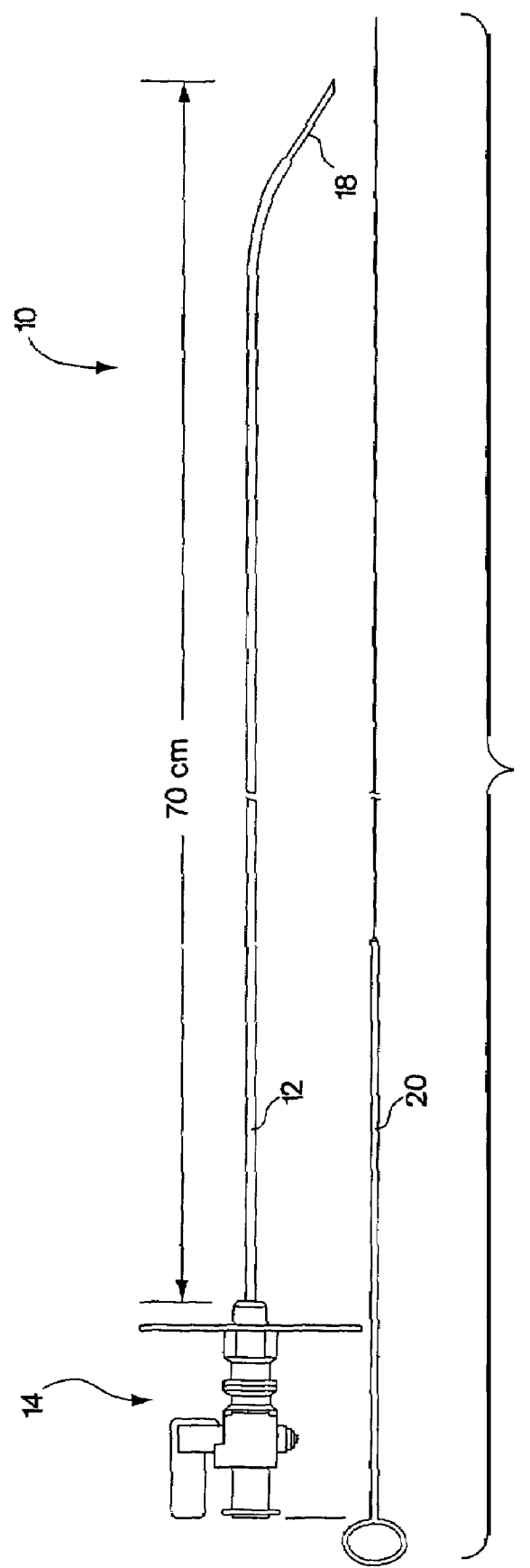
FIG. 28 shows a cross-sectional view of a transseptal needle system according to the present invention.
Figure 29:
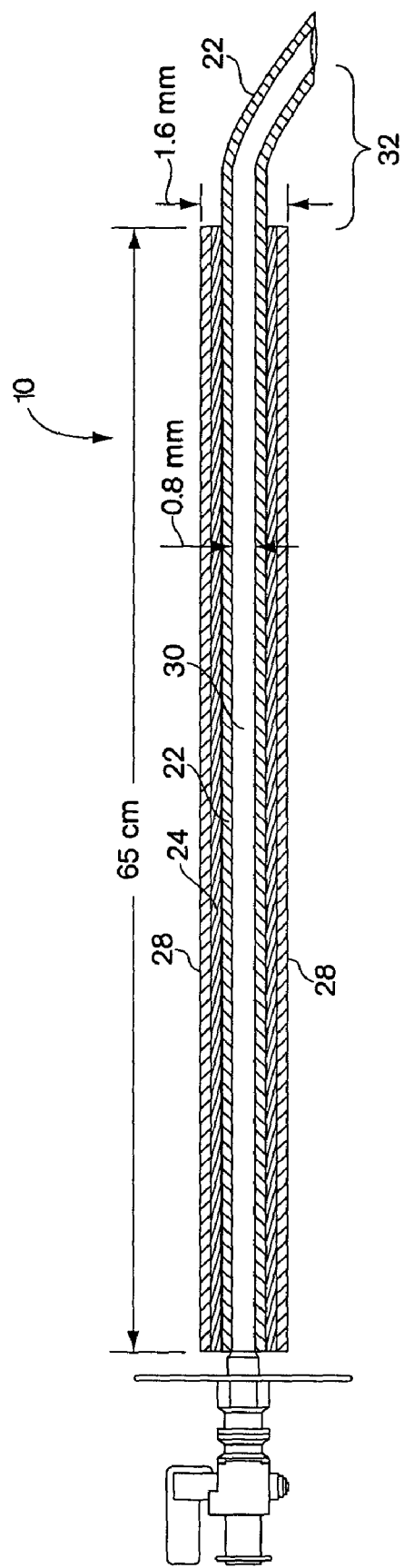
FIG. 29 shows in more detail a schematic of a cross-section of a transseptal needle system according to the present invention.

In one embodiment, a transseptal needle antenna system according to the present invention integrates the loopless antenna and transseptal needle into a single device capable of both generating MR signal and puncturing the interatrial septum or any other myocardial wall. The loopless antenna will require matching-tuning decoupling and balun circuitry in order to interface with the MR scanner, as described in U.S. Pat. No. 5,699,801 to Atalar et al., and U.S. Pat. No. 5,928,145 to Ocali et al., the contents of which are incorporated herein by reference. The matching, tuning, decoupling and balun circuitry, components of the interface assembly, would be attached by standard electrical connectors (not shown) to the proximal end of needle system, as would be understood by those of ordinary skill in the art. Constructing a transseptal needle system according to the present invention may be accomplished by converting a custom Nitinol tube into a dipole antenna, and further providing a sharpened distalmost end for penetrating a myocardial wall. As shown in FIG. 28, a transseptal needle imaging needle 10 may be constructed from an 18-gauge Nitinol tube 12 and attached to a brass stopcock 14. An obturator 20 is provided to be inserted through the lumen of the transseptal needle 10, using techniques familiar to practitioners in the arts. To convert the needle into a dipole antenna, one may separate the needle into two separate poles. To accomplish this, as shown in FIG. 29, one embodiment of the present invention provides that the entire length of the needle shaft 30 may be coated with a 0.5-mm layer of platinum 22 to improve the conducting properties of Nitinol. In one embodiment, the needle shaft 30 may be approximately 70 cm. in length. The proximal portion of the needle shaft 30, measuring approximately 65-cm, is then covered with a 0.3-mm layer of Teflon dielectric 24 to isolate the needle shaft, which then acts as an inner conductor. The outer conductor layer 28 may be constructed by coating the dielectric 24 with 0.5-mm platinum coating. It is understood that other conductors and other insulator/dielectrics may be used to accomplish these functions. Thus the 5 cm of the needle shaft (inner conductor) not covered by dielectric serves as both the antenna whip 32 and the puncturing device. The outer conductor 28 of the needle, which is used to carry the MR signal to the antenna circuitry, serves as one pole, while the inner conductor serves as the second pole that receives the MR signal generated following body coil excitation of the slice volume. Because of the extremely high sensitivity and SNR in the immediate vicinity of the antenna, near microscopic resolution is a possible. It is understood that modifications of these steps of construction will be apparent to practitioners of ordinary skill in the art, and are to be included within the scope of the present invention. For example, variations may include the the insulating and conducting materials selected, the thicknesses of the insulating and conducting layers, or the length along which a particular material is applied.

Transseptal procedures may be performed using a modified Brockenborough needle antenna and either a Mullins sheath or a Swartz sheath and dilator. In one practice of the methods of the present invention, the needle antenna is connected to a standard catheterization manifold by a short length of flexible tubing for pressure measurement and recording. The needle antenna is connected to the decoupling and tuning circuitry and interfaced to the scanner via a surface coil box. Scout images are obtained with the cardiac phased array coil using a gated fast gradient echo in standard fluoroscopic views (right anterior oblique 45 and left anterior oblique 40) which provide en face and longitudinal views of the interatrial septum respectively. The active coil is then switched to the needle antenna and imaging is performed using a real-time fluoroscopy sequence (temporal resolution=8 frames/sec) for positioning of the sheath/antenna needle. As the needle antenna is an unbalanced dipole antenna, the current profile on the surface of the shaft allows the entire trajectory of the needle to be visualized. Needle images can then be superimposed upon the transthoracic images of the atrium and septum and thus the needle can be navigated to the fossa ovalis using active tracking. The transseptal sheath is placed in the superior vena cava and then the sheath/needle combination is withdrawn inferiorly in the left anterior oblique projection until the tip of the dilator "pops" into the fossa ovalis. Positioning is checked in a right anterior oblique view to ensure that the tip of the needle/sheath assembly is pointing directly away from the plane of vision and slightly anterior. Once the fossa is engaged, the tip of the needle, which is also the antenna whip or inner conductor, is advanced to check for "tenting" of the fossa which is typically just below the level of the His recording catheter in the left anterior oblique 40 projection and well behind the His catheter electrodes in the right anterior oblique 45 is clearly visualized. Once this is confirmed, the needle antenna is advanced and puncture of the fossa can be directly visualized. The needle is then advanced further to determine if entrance into the left atrium. The sheath is then advanced over the needle into the left atrium. Once the dilator is well into the left atrium, the sheath is advanced over the dilator, with the needle just inside the dilator to give support for advancement of the sheath.

It is understood that these systems and methods may be employed for a variety of diagnostic and therapeutic purposes where near-microscopic visualization of intracardiac structures may be useful as visualized through a transseptal approach. Furthermore, the systems and methods of the present invention may be employed whenever an approach to a cardiac structure may be advantageously achieved through needle puncture. The present invention may be combined with other techniques for manipulating the structure being visualized thereby. In certain embodiments, for example, the mitral valve could be visualized using the systems and methods of the present invention, and further invasive procedures could be carried out on this structure under direct MRI visualization, procedures that could include such techniques as valvulotomy, valvuloplasty or valve replacement. Other transmyocardial approaches to cardiac structures are also contemplated by the present invention, assuming that those other cardiac structures are accessible by needle puncture. For example, the present invention could be used to pass from the myocardium to an adjacent coronary artery by needle puncture technique, with the coronary interior being visualizable by these systems and methods. While one embodiment of the present invention has been described with reference to a transseptal needle system, it is understood that other needle systems are encompassed by the scope of the inventive systems and methods.

While the invention has been disclosed in connection with the preferred embodiments shown and described in detail, various modifications and improvements thereon will become readily apparent to those skilled in the art. Accordingly, the spirit and scope of the present invention is limited only by the following claims.

The invention claimed is:

1. An intracranial needle magnetic resonance imaging antenna system, comprising:
    a probe shaft having a distal end and a proximal end, the distal end of the probe shaft having a hollow needle at a distalmost end sharpened for penetrating central nervous system tissue, wherein the probe shaft is tubular and comprises an open lumen extending axially through the distalmost sharpened end, and the probe shaft further comprising a first conductor;
    an insulator or dielectric covering the first conductor over at least the proximal portion of the probe shaft; and
    a second conductor covering the insulator or dielectric;
    wherein the first conductor, the insulator or dielectric, and the second conductor define a magnetic resonance imaging antenna, and wherein the first conductor defines the hollow needle with the open lumen and has sufficient rigidity to penetrate the tissue.

2. The system of claim 1, wherein the antenna comprises a loopless antenna.

3. The system of claim 1, further comprising an interface electrically coupled to the first conductor and the second conductor, the interface comprising tuning, matching, and decoupling circuitry.

4. The system of claim 1, wherein the proximal end of the probe shaft comprises a connector portion electrically coupled to the first conductor and the second conductor for connecting to a magnetic resonance scanner.

5. The system of claim 1, further comprising a balun circuit.

6. The system of claim 1, further comprising an interventional member in communication with the probe shaft.

7. A method for accessing an intracranial region of interest using magnetic resonance imaging, comprising:
    providing an intracranial magnetic resonance imaging antenna system as set forth in claim 1;
    employing the sharpened distalmost end of the probe shaft to penetrate central nervous system tissue;
    receiving magnetic resonance imaging signals from the antenna;
    tracking the progress of the antenna system in response to the signals received from the antenna; and
    directing the antenna system toward the intracranial region of interest in response to the signals received from the antenna.

8. The method of claim 7, further comprising ablating central nervous system tissue at the intracranial region of interest based on positional guidance of an interventional member cooperating with the probe shaft using the directing step.

9. The system of claim 1, wherein the lumen is a center lumen defined by a tubular body that extends between the proximal and distal ends of the probe shaft.

10. The system of claim 9, further comprising an obturator sized and configured to releasably reside in the lumen and extend through the sharpened end of the probe shaft.

11. The system of claim 1, wherein the probe shaft is a Nitinol tube having sufficient rigidity to define the sharpened distal end that is configured to penetrate the tissue.

12. The system of claim 11, further comprising a metallic coating on a distal portion of the Nitinol tube and a non-conductive coating on a proximal portion of the Nitinol tube.

13. The system of claim 1, wherein a distal end portion of the probe shaft has a curvature that curves away from a straight axial extension which extends from a location upstream of the sharpened end through the sharpened end.

14. The system of claim 12, wherein the metallic coating comprises platinum.

15. An endovascular magnetic resonance imaging antenna system, comprising:
   a probe shaft having a distal end and a proximal end, the distal end of the probe shaft having a hollow first conductor with a distalmost end sharpened for penetrating vascular tissue with the hollow first conductor having an open lumen extending axially through the distalmost sharpened end, wherein the probe shaft is tubular;
   an insulator or dielectric covering the first conductor over at least the proximal portion of the probe shaft; and
   a second conductor covering the insulator or dielectric;
   wherein the first conductor, the insulator or dielectric, and the second conductor define a magnetic resonance imaging antenna.

16. The system of claim 15, wherein the antenna comprises a loopless antenna.

17. The system of claim 15, further comprising an interface electrically coupled to the first conductor and the second conductor, the interface comprising tuning, matching, and decoupling circuitry.

18. The system of claim 15, wherein the proximal end of the probe shaft comprises a connector portion electrically coupled to the first conductor and the second conductor for connecting to a magnetic resonance scanner.

19. The system of claim 15, further comprising a balun circuit.

20. The system of claim 15, further comprising an interventional tool in communication with the probe shaft.

21. A method for accessing an endovascular region of interest using magnetic resonance imaging, comprising:
   providing an endovascular magnetic resonance imaging antenna system as set forth in claim 15;
   employing the sharpened distalmost end of the probe shaft to penetrate vascular tissue;
   receiving magnetic resonance imaging signals from the antenna;
   tracking the progress of the antenna system in response to the signals received from the antenna; and
   directing the antenna system toward the endovascular region of interest in response to the signals received from the antenna.

22. The method of claim 21, further comprising ablating endovascular tissue at the region of interest based on positional guidance of an interventional member cooperating with the probe shaft using the directing step.

23. The system of claim 15, wherein the lumen is a center lumen defined by a tubular body that extends from a proximal end portion through the distalmost sharpened end of the probe shaft.

24. The system of claim 23, further comprising an obturator sized and configured to releasably reside in the lumen and extend through the sharpened end of the probe shaft.

25. The system of claim 15, wherein a distal end portion of the probe shaft has a curvature that curves away from a straight axial extension which extends from a location upstream of the sharpened end through the sharpened end.

26. A genitourinary magnetic resonance imaging antenna system, comprising:
   a probe shaft having a distal end and a proximal end, the distal end of the probe shaft having a hollow needle with an open lumen at a distalmost end sharpened for penetrating genitourinary tissue, wherein the probe shaft is tubular and the probe shaft further comprises a first conductor that extends to the sharpened distalmost end of the probe shaft and defines the hollow needle;
   an insulator or dielectric covering the first conductor over at least the proximal portion of the probe shaft; and
   a second conductor covering the insulator or dielectric;
   wherein the first conductor, the insulator or dielectric, and the second conductor define a magnetic resonance imaging antenna.

27. The system of claim 26, wherein the antenna comprises a loopless antenna.

28. The system of claim 26, further comprising an interface electrically coupled to the first conductor and the second conductor, the interface comprising tuning, matching, and decoupling circuitry.

29. The system of claim 26, wherein the proximal end of the probe shaft comprises a connector portion electrically coupled to the first conductor and the second conductor for connecting to a magnetic resonance scanner.

30. The system of claim 29, wherein the connector is a snap-fit connector.

31. The system of claim 26, further comprising a balun circuit.

32. The system of claim 26, further comprising an interventional tool in communication with the probe shaft.

33. A method for accessing a genitourinary region of interest using magnetic resonance imaging, comprising:
   providing a genitourinary magnetic resonance imaging antenna system as set forth in claim 26;
   employing the sharpened distalmost end of the probe shaft to penetrate genitourinary tissue;
   receiving magnetic resonance imaging signals from the antenna;
   tracking the progress of the antenna system in response to the signals received from the antenna; and
   directing the antenna system toward the genitourinary region of interest in response to the signals received from the antenna.

34. The method of claim 33, further comprising ablating genitourinary tissue at the region of interest based on positional guidance of an interventional member cooperating with the probe shaft using the directing step.

35. The method of claim 33, wherein the genitourinary region of interest comprises bladder tissue.

36. The method of claim 33, wherein the genitourinary region of interest comprises urethral tissue.

37. The method of claim 33, wherein the genitourinary region of interest comprises prostatic tissue.

38. The method of claim 33, wherein the genitourinary region of interest comprises uterine tissue.

39. The method of claim 33, wherein the genitourinary region of interest comprises cervical tissue.

40. The method of claim 33, wherein the genitourinary region of interest comprises ovarian tissue.

41. The system of claim 26, wherein the lumen is a center lumen defined by a tubular body that extends from a proximal end portion through the distalmost sharpened end of the probe shaft.

42. The system of claim 41, further comprising an obturator sized and configured to releasably reside in the lumen and extend through the sharpened end of the probe shaft.

43. The system of claim 26, wherein a distal end portion of the probe shaft has a curvature that curves away from a straight axial extension which extends from a location upstream of the sharpened end through the sharpened end.

44. A nasogastric magnetic resonance imaging antenna system, comprising:
 a probe shaft having a distal end and a proximal end, the distal end of the probe shaft having a hollow needle with an axially extending open lumen at a distalmost end sharpened for penetrating nasogastric tissue, wherein the probe shaft is tubular and comprises a first conductor that defines the hollow needle;
 an insulator or dielectric covering the first conductor over at least the proximal portion of the probe shaft; and
 a second conductor covering the insulator or dielectric;
 wherein the first conductor, the insulator or dielectric, and the second conductor define a magnetic resonance imaging antenna.

45. The system of claim 44, wherein the antenna comprises a loopless antenna.

46. The system of claim 44, further comprising an interface electrically coupled to the first conductor and the second conductor, the interface comprising tuning, matching, and decoupling circuitry.

47. The system of claim 44, wherein the proximal end of the probe shaft comprises a connector portion electrically coupled to the first conductor and the second conductor for connecting to a magnetic resonance scanner.

48. The system of claim 44, further comprising a balun circuit.

49. The system of claim 44, further comprising an interventional tool in communication with the probe shaft.

50. A method for accessing a nasogastric region of interest using magnetic resonance imaging, comprising:
 providing a nasogastric magnetic resonance imaging antenna system as set forth in claim 44;
 employing the sharpened distalmost end of the probe shaft to penetrate nasogastric tissue;
 receiving magnetic resonance imaging signals from the antenna;
 tracking the progress of the antenna system in response to the signals received from the antenna; and
 directing the antenna system toward the nasogastric region of interest in response to the signals received from the antenna.

51. The method of claim 50, further comprising ablating nasogastric tissue based on positional guidance of an interventional member cooperating with the probe shaft using the directing step.

52. An endotracheal magnetic resonance imaging antenna system, comprising:
 a probe shaft having a distal end and a proximal end, the distal end of the probe shaft having a hollow needle with an open lumen at a distalmost end sharpened for penetrating tracheal tissue, wherein the probe shaft is tubular and comprises an open lumen extending axially through the distalmost sharpened end and the probe shaft further comprising a first conductor, wherein the first conductor defines the hollow needle;
 an insulator or dielectric covering the first conductor over at least the proximal portion of the probe shaft; and
 a second conductor covering the insulator or dielectric;
 wherein the first conductor, the insulator or dielectric, and the second conductor define a magnetic resonance imaging antenna.

53. The system of claim 52, wherein the antenna comprises a loopless antenna.

54. The system of claim 52, further comprising an interface electrically coupled to the first conductor and the second conductor, the interface comprising tuning, matching, and decoupling circuitry.

55. The system of claim 52, wherein the proximal end of the probe shaft comprises a connector portion electrically coupled to the first conductor and the second conductor for connecting to a magnetic resonance scanner.

56. The system of claim 52, further comprising a balun circuit.

57. The system of claim 52, further comprising an interventional tool in communication with the probe shaft.

58. A method for accessing an endotracheal region of interest using magnetic resonance imaging, comprising:
 providing an endotracheal magnetic resonance imaging antenna system as set forth in claim 52;
 employing the sharpened distalmost end of the probe shaft to penetrate tracheal tissue;
 receiving magnetic resonance imaging signals from the antenna;
 tracking the progress of the antenna system in response to the signals received from the antenna; and
 directing the antenna system toward the endotracheal region of interest in response to the signals received from the antenna.

59. The method of claim 58, further comprising ablating endotracheal tissue based on positional guidance of an interventional member cooperating with the probe shaft using the directing step.

60. An endobiliary magnetic resonance imaging antenna system, comprising:
 a probe shaft having a distal end and a proximal end, the distal end of the probe shaft having a hollow needle at a distalmost end sharpened for penetrating biliary tissue, wherein the probe shaft is tubular and comprises an open lumen extending axially through the distalmost sharpened end and the probe shaft further comprising a first conductor that defines the hollow needle with the open lumen;
 an insulator or dielectric covering the first conductor over at least the proximal portion of the probe shaft; and
 a second conductor covering the insulator or dielectric;
 wherein the first conductor, the insulator or dielectric, and the second conductor form a magnetic resonance imaging antenna.

61. The system of claim 60, wherein the antenna comprises a loopless antenna.

62. The system of claim 60, further comprising an interface electrically coupled to the first conductor and the second conductor, the interface comprising tuning, matching, and decoupling circuitry.

63. The system of claim 60, wherein the proximal end of the probe shaft comprises a connector portion electrically coupled to the first conductor and the second conductor for connecting to a magnetic resonance scanner.

64. The system of claim 60, further comprising a balun circuit.

65. The system of claim 60, further comprising an interventional tool in communication with the probe shaft.

66. A method for accessing an endobiliary region of interest using magnetic resonance imaging, comprising:
   providing an endobiliary magnetic resonance imaging antenna system as set forth in claim 60;
   employing the sharpened distalmost end of the probe shaft to penetrate biliary tissue;
   receiving magnetic resonance imaging signals from the antenna;
   tracking the progress of the antenna system in response to the signals received from the antenna; and
   directing the antenna system toward the endobiliary region of interest in response to the signals received from the antenna.

67. The method of claim 66, further comprising ablating endobiliary tissue based on positional guidance of an interventional member cooperating with the probe shaft using the directing step.

68. A peritoneal magnetic resonance imaging antenna system, comprising:
   a probe shaft having a distal end and a proximal end, the distal end of the probe shaft having a hollow needle at a distalmost end sharpened for penetrating peritoneal tissue, wherein the probe shaft is tubular and comprises an open lumen extending axially through the distalmost sharpened end and the probe shaft further comprising a first conductor, wherein the first conductor defines the hollow needle;
   an insulator or dielectric covering the first conductor over at least the proximal portion of the probe shaft; and
   a second conductor covering the insulator or dielectric;
   wherein the first conductor, the insulator or dielectric, and the second conductor define a magnetic resonance imaging antenna.

69. The system of claim 68, wherein the antenna comprises a loopless antenna.

70. The system of claim 68, further comprising an interface electrically coupled to the first conductor and the second conductor, the interface comprising tuning, matching, and decoupling circuitry.

71. The system of claim 68, wherein the proximal end of the probe shaft comprises a connector portion electrically coupled to the first conductor and the second conductor for connecting to a magnetic resonance scanner.

72. The system of claim 68, further comprising a balun circuit.

73. The system of claim 68, further comprising an interventional tool in communication with the probe shaft.

74. A method for accessing a peritoneal region of interest using magnetic resonance imaging, comprising:
   providing a peritoneal magnetic resonance imaging antenna system as set forth in claim 68;
   employing the sharpened distalmost end of the probe shaft to penetrate peritoneal tissue;
   receiving magnetic resonance imaging signals from the antenna;
   tracking the progress of the antenna system in response to the signals received from the antenna; and
   directing the antenna system toward the peritoneal region of interest in response to the signals received from the antenna.

75. The method of claim 74, further comprising ablating peritoneal tissue at the region of interest based on positional guidance of an interventional member cooperating with the probe shaft using the directing step.

76. An intradural magnetic resonance imaging antenna system, comprising:
   a probe shaft having a distal end and a proximal end, the distal end of the probe shaft having a hollow needle at a distalmost end sharpened for penetrating dural tissue, wherein the probe shaft is tubular and comprises an open lumen extending axially through the distalmost sharpened end, and the probe shaft further comprising a first conductor, wherein the first conductor defines the hollow needle;
   an insulator or dielectric covering the first conductor over at least the proximal portion of the probe shaft; and
   a second conductor covering the insulator or dielectric;
   wherein the first conductor, the insulator or dielectric, and the second conductor form a magnetic resonance imaging antenna.

77. The system of claim 76, wherein the antenna comprises a loopless antenna.

78. The system of claim 76, further comprising an interface electrically coupled to the first conductor and the second conductor, the interface comprising tuning, matching, and decoupling circuitry.

79. The system of claim 76, wherein the proximal end of the probe shaft comprises a connector portion electrically coupled to the first conductor and the second conductor for connecting to a magnetic resonance scanner.

80. The system of claim 76, further comprising a balun circuit.

81. The system of claim 76, further comprising an interventional tool in communication with the probe shaft.

82. A method for accessing an intradural region of interest using magnetic resonance imaging, comprising:
   providing an intradural magnetic resonance imaging antenna system as set forth in claim 76;
   employing the sharpened distalmost end of the probe shaft to penetrate dural tissue;
   receiving magnetic resonance imaging signals from the antenna;
   tracking the progress of the antenna system in response to the signals received from the antenna; and
   directing the antenna system toward the intradural region of interest in response to the signals received from the antenna.

83. The method of claim 82, further comprising ablating dural tissue at the region of interest based on positional guidance of an interventional member cooperating with the probe shaft using the directing step.

84. An intraarticular magnetic resonance imaging antenna system, comprising:
   a probe shaft having a distal end and a proximal end, the distal end of the probe shaft having a hollow needle at a distalmost end sharpened for penetrating articular tissue, wherein the probe shaft is tubular and comprises an open lumen extending axially through the distalmost sharpened end, and the probe shaft further comprising a first conductor that defines the;
   an insulator or dielectric covering the first conductor over at least the proximal portion of the probe shaft; and
   a second conductor covering the insulator or dielectric;
   wherein the first conductor, the insulator or dielectric, and the second conductor define a magnetic resonance imaging antenna.

85. The system of claim 84, wherein the antenna comprises a loopless antenna.

86. The system of claim 84, further comprising an interface electrically coupled to the first conductor and the second conductor, the interface comprising tuning, matching, and decoupling circuitry.

87. The system of claim 84, wherein the proximal end of the probe shaft comprises a connector portion electrically coupled to the first conductor and the second conductor for connecting to a magnetic resonance scanner.

88. The system of claim 84, further comprising a balun circuit.

89. The system of claim 84, further comprising an interventional tool in communication with the probe shaft.

90. A method for accessing an intraarticular region of interest using magnetic resonance imaging, comprising:
   providing an intraarticular magnetic resonance imaging antenna system as set forth in claim 84;
   employing the sharpened distalmost end of the probe shaft to penetrate articular tissue;
   receiving magnetic resonance imaging signals from the antenna;
   tracking the progress of the antenna system in response to the signals received from the antenna; and
   directing the antenna system toward the intraarticular region of interest in response to the signals received from the antenna.

91. The method of claim 90, further comprising ablating articular tissue at the region of interest based on positional guidance of an interventional member cooperating with the probe shaft using the directing step.

92. A nasopharyngeal magnetic resonance imaging antenna system, comprising:
   a probe shaft having a distal end and a proximal end, the distal end of the probe shaft having a hollow needle at a distalmost end sharpened for penetrating nasopharyngeal tissue, wherein the probe shaft is tubular and comprises an open lumen extending axially through the distalmost sharpened end, and the probe shaft further comprising a first conductor that defines the hollow needle;
   an insulator or dielectric covering the first conductor over at least the proximal portion of the probe shaft; and
   a second conductor covering the insulator or dielectric;
   wherein the first conductor, the insulator or dielectric, and the second conductor define a magnetic resonance imaging antenna.

93. The system of claim 92, wherein the antenna comprises a loopless antenna.

94. The system of claim 92, further comprising an interface electrically coupled to the first conductor and the second conductor, the interface comprising tuning, matching, and decoupling circuitry.

95. The system of claim 92, wherein the proximal end of the probe shaft comprises a connector portion electrically coupled to the first conductor and the second conductor for connecting to a magnetic resonance scanner.

96. The system of claim 92, further comprising a balun circuit.

97. The system of claim 92, further comprising an interventional tool in communication with the probe shaft.

98. A method for accessing a nasopharyngeal region of interest using magnetic resonance imaging, comprising:
   providing a nasopharyngeal magnetic resonance imaging antenna system as set forth in claim 92;
   employing the sharpened distalmost end of the probe shaft to penetrate nasopharyngeal tissue;
   receiving magnetic resonance imaging signals from the antenna;
   tracking the progress of the antenna system in response to the signals received from the antenna; and
   directing the antenna system toward the nasopharyngeal region of interest in response to the signals received from the antenna.

99. The method of claim 98, further comprising ablating nasopharyngeal tissue at the region of interest based on positional guidance of an interventional member cooperating with the probe shaft using the directing step.

100. A magnetic resonance imaging needle antenna system, comprising:
   a tubular needle probe shaft having a length with opposing distal and proximal ends, the distal end of the probe shaft having a needle defined by a sufficiently rigid hollow first conductor with a distalmost end sharpened for penetrating target tissue and with the hollow first conductor having an open longitudinally extending lumen extending through the distalmost sharpened end;
   an insulator or dielectric covering a major length of the first conductor at a location starting upstream of a distal end portion of the needle; and
   a second conductor over the insulator or dielectric;
   wherein the first conductor, the insulator or dielectric, and the second conductor define a magnetic resonance imaging antenna with the first conductor being a first pole and the second conductor being a second pole of a dipole loopless magnetic resonance receive antenna, and wherein the distal end portion of the needle defines an antenna whip of the antenna.

101. A magnetic resonance imaging needle antenna system according to claim 100, further comprising, a connector and an MRI scanner interface with matching and tuning circuitry adapted to cooperate with an MRI Scanner for MRI-guided interventional procedures, and wherein the distal end portion of the needle has a curvature that curves away from a straight axial extension which extends from a location upstream of the sharpened end through the sharpened end.

102. A magnetic resonance imaging needle antenna system according to claim 100, wherein the probe shaft is a Nitinol tube having sufficient rigidity to define the sharpened distalmost end that is configured to penetrate the tissue, and wherein the Nitinol tube comprises a metallic coating on at least a distal portion of the Nitinol tube and a non-conductive coating over the metallic portion and/or on a proximal portion of the Nitinol tube.

103. A magnetic resonance imaging needle antenna system according to claim 100, further comprising an interventional tool configured to cooperate with the probe shaft to thereby deliver a therapy to a patient.

* * * * *